United States Patent
Matsubara et al.

(10) Patent No.: US 8,782,579 B2
(45) Date of Patent: Jul. 15, 2014

(54) CONNECTION VERIFICATION METHOD, RECORDING MEDIUM THEREOF, AND CONNECTION VERIFICATION APPARATUS

(75) Inventors: Satoshi Matsubara, Kawasaki (JP); Akira Kurokawa, Yokohama (JP)

(73) Assignees: Fujitsu Limited, Kawasaki (JP); Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/280,961

(22) Filed: Oct. 25, 2011

(65) Prior Publication Data
US 2012/0110527 A1    May 3, 2012

(30) Foreign Application Priority Data
Nov. 1, 2010 (JP) ................... 2010-245709

(51) Int. Cl.
*G06F 9/455* (2006.01)
*G06F 17/50* (2006.01)

(52) U.S. Cl.
USPC ............ 716/106; 716/101; 716/110; 716/111

(58) Field of Classification Search
USPC ........................................ 716/106
See application file for complete search history.

(56) References Cited

U.S. PATENT DOCUMENTS

2003/0200515 A1* 10/2003 Ly et al. ............................ 716/5
2009/0138837 A1* 5/2009 Baumgartner et al. ........... 716/6

FOREIGN PATENT DOCUMENTS

| JP | 2000-340660 | 12/2000 |
|---|---|---|
| JP | 2002-169852 | 6/2002 |
| JP | 2003-303218 | 10/2003 |
| JP | 2005-190442 A | 7/2005 |
| JP | 2005-196681 | 7/2005 |
| JP | 2007-310670 | 11/2007 |

OTHER PUBLICATIONS

Chung et al., Logic Design Error Diagnosis and Correction, Sep. 1994, IEEE Transactions on Very Large Scale Integration Systems, vol. 2 No. 3, pp. 320-332.*
Office Action of Japanese Patent Application 2010-245709 dated Jan. 14, 2014 with Full English Translation of the Office Action.

* cited by examiner

*Primary Examiner* — Paul Dinh
*Assistant Examiner* — Bryce Aisaka
(74) *Attorney, Agent, or Firm* — Fujitsu Patent Center

(57) ABSTRACT

A connection verification method is disclosed. A computer verifies a connection between a first node and a second node by starting from the first node in a designed integrated circuit, based on connection information stored in a storage part. The computer detects whether a module connected to the second node is a predetermined module predetermined module having a logic condition therein, based on connection relationship logic information stored in the storage part. The computer conducts a connection verification starting the module to verify a connection between the module and a third node when the module is the predetermined module.

12 Claims, 37 Drawing Sheets

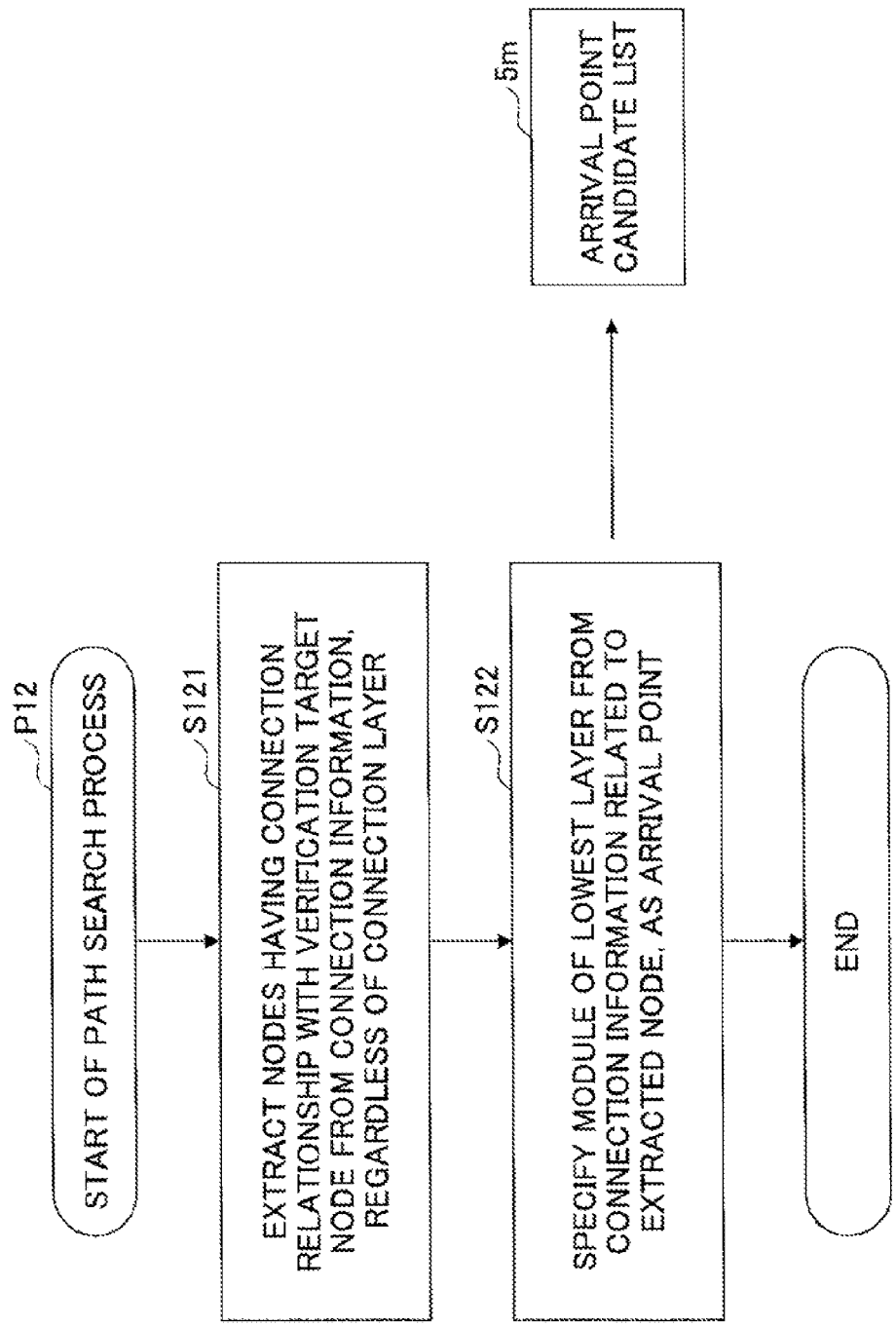

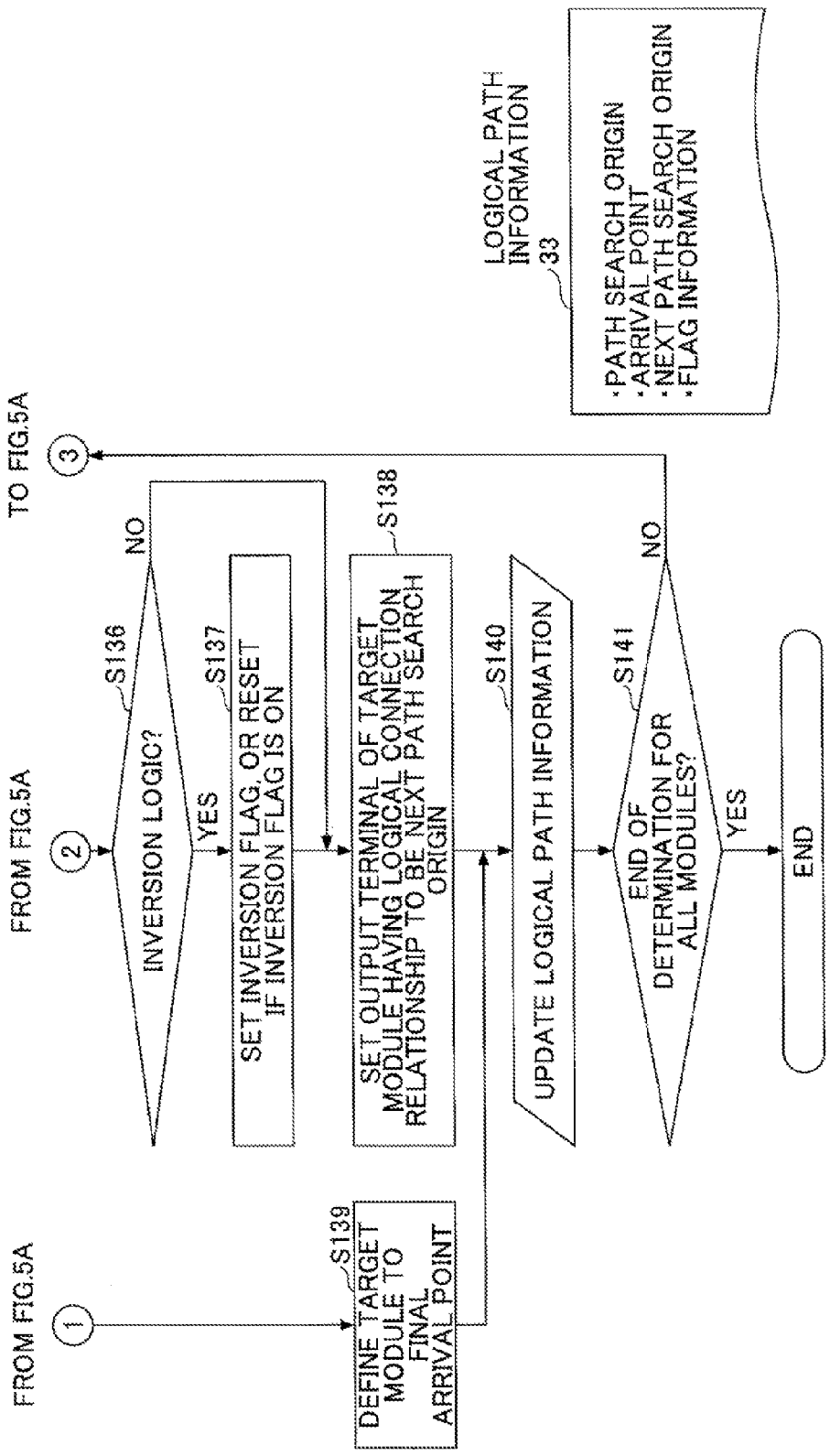

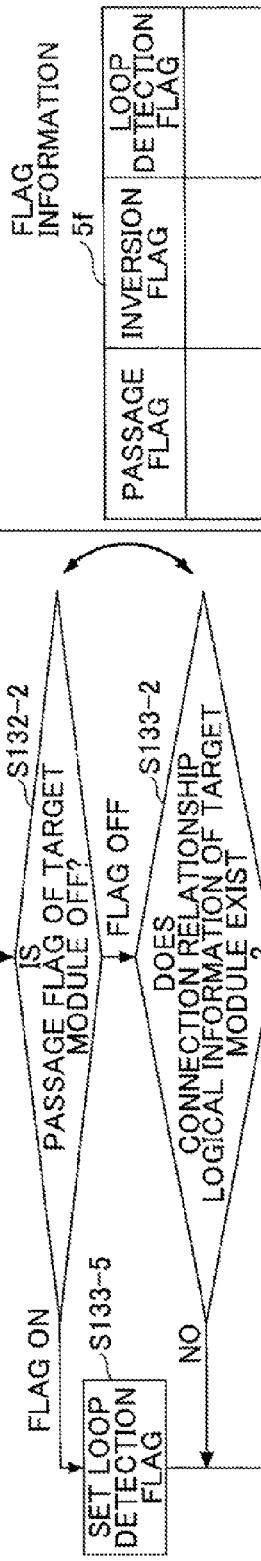

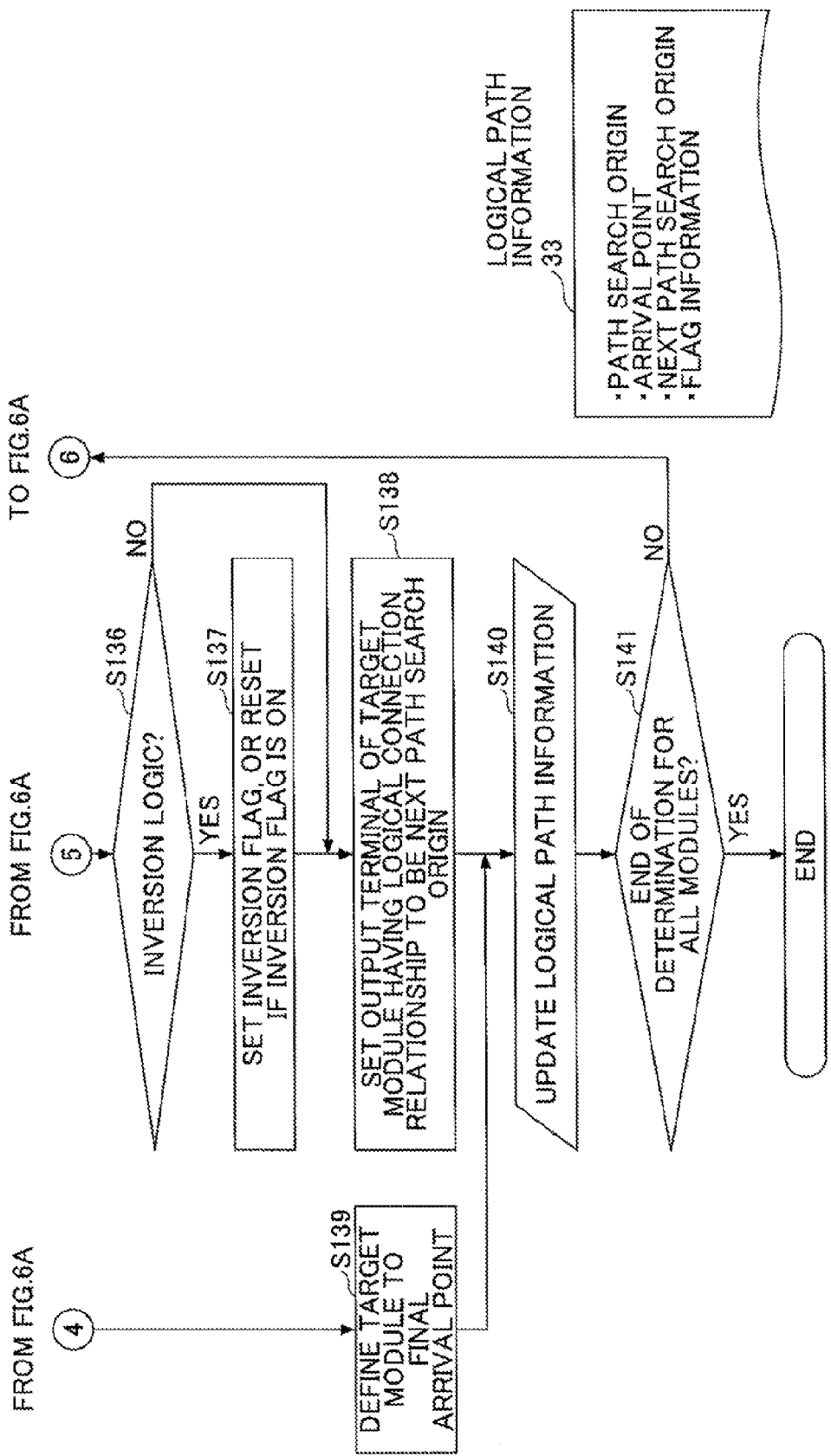

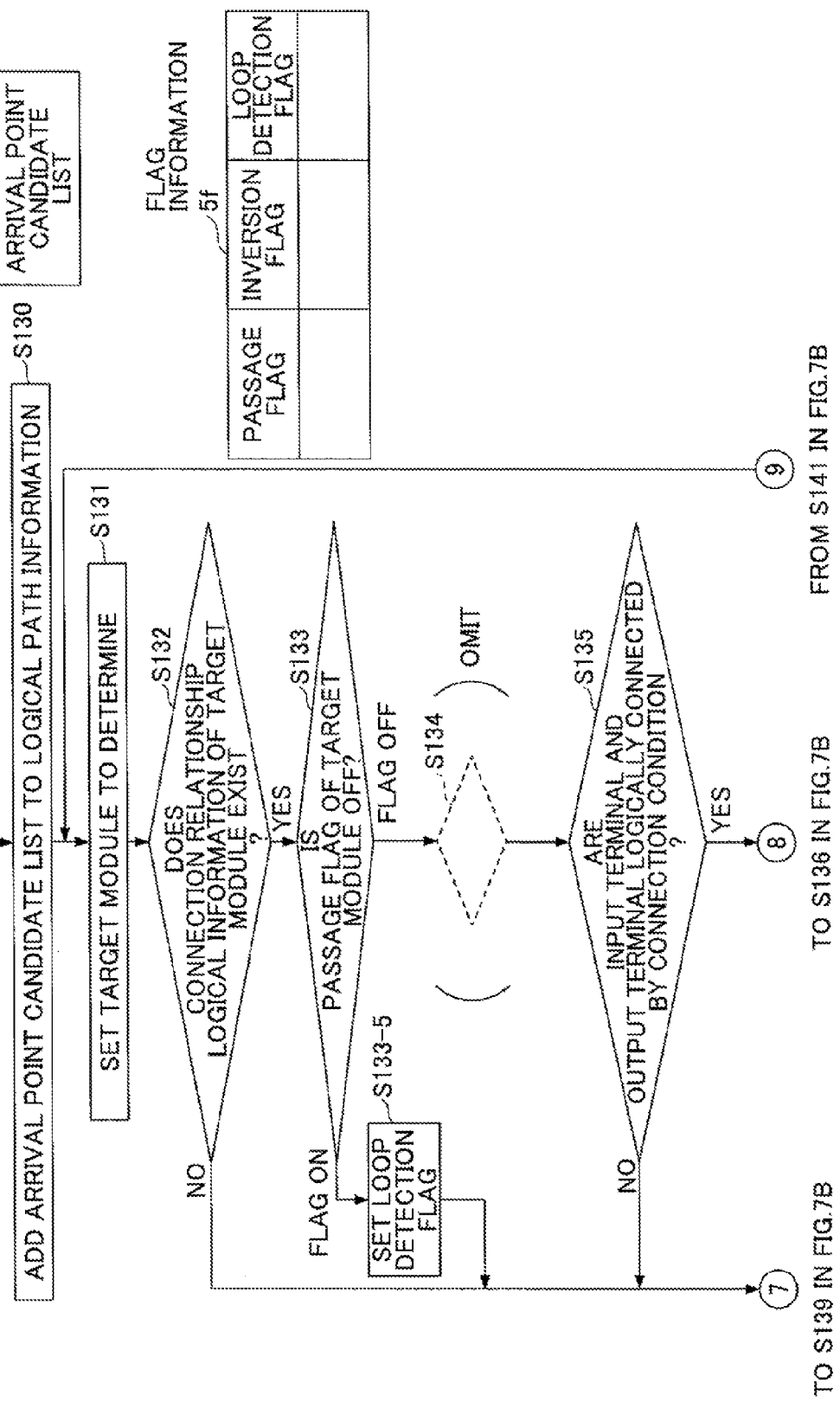

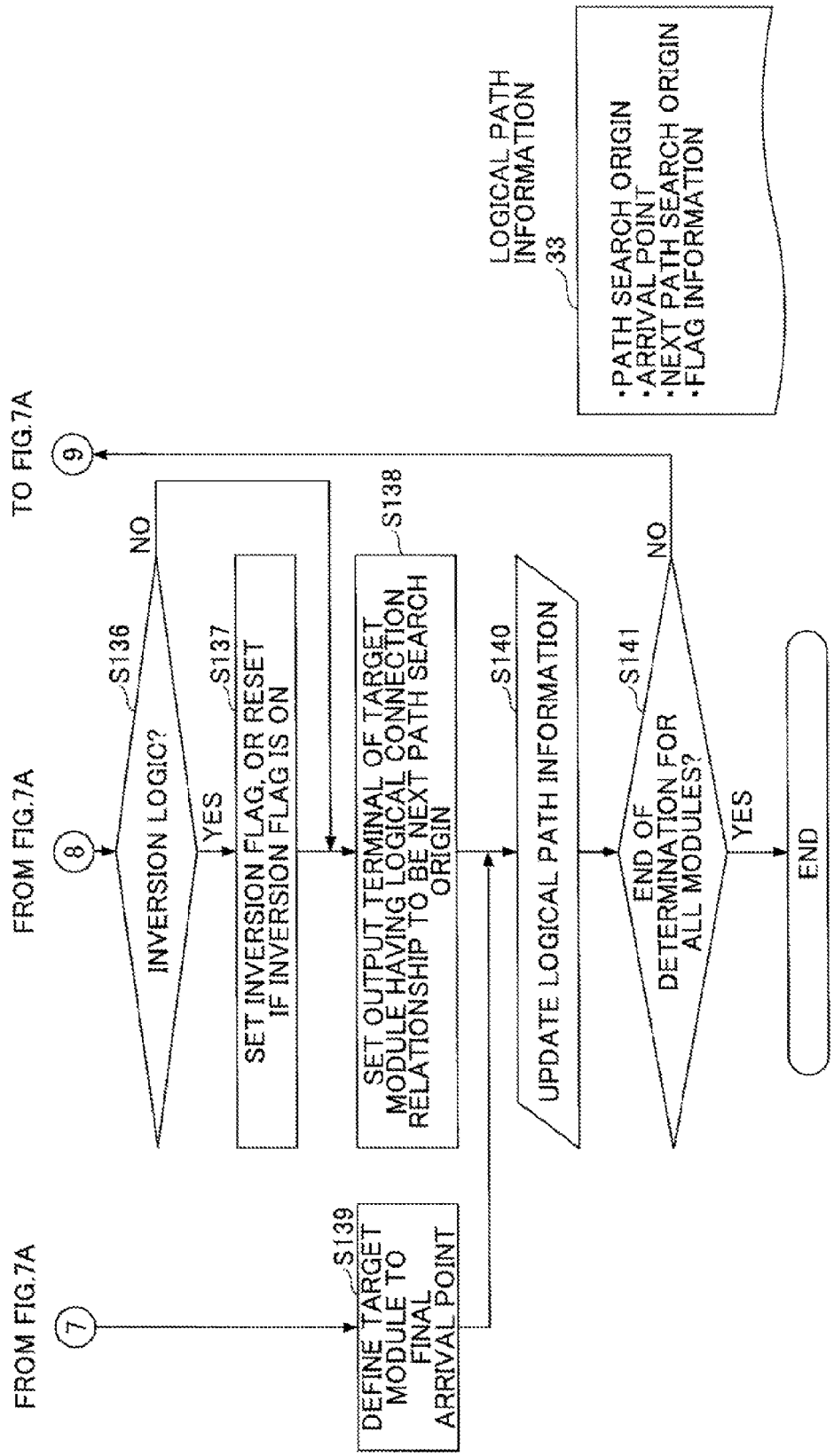

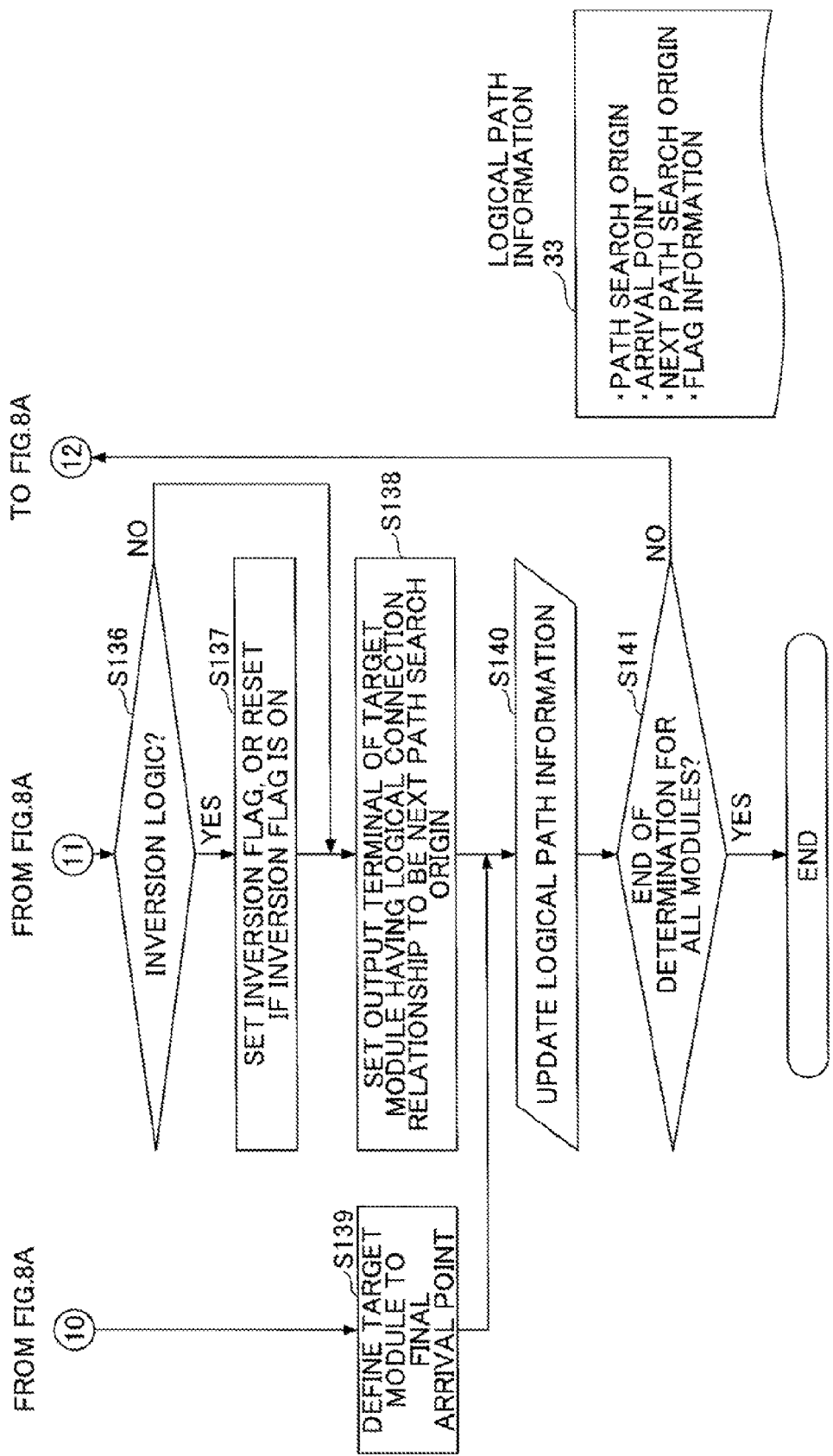

98 NEGATIVE FEEDBACK LOOP CIRCUIT

FIG.18A

| MODULE NAME | CONNECTION CONDITION |
|---|---|
| BUF_A | OUT=IN |

CONNECTION RELATIONSHIP LOGIC INFORMATION 32-1

FIG.18B

| CONNECTION CONDITION | CONNECTION ORIGINATOR POINT | CONNECTION DESTINATION POINT |
|---|---|---|
| none | P_IA | BLK_A1.BLK_A2.I2_AA |
| none | P_IA | SEL_B.A1 |

CONNECTION SPECIFICATION 34-1

FIG.18C

| COUNT 1 | COUNT 2 | PATH SEARCH ORIGIN | ARRIVAL POINT | NEXT PATH SEARCH ORIGIN | FLAG INFORMATION 5f ||| 
| | | | | | PASSAGE FLAG | INVERSION FLAG | LOOP DETECTION FLAG |
|---|---|---|---|---|---|---|---|
| 0 | 0 | P_IA | BUF_A.IN | BUF_A.OUT | 1 | 0 | 0 |
| | | | SEL_B.A1 | | 0 | 0 | 0 |
| | 1 | BUF_A.OUT | BLK_A1.I1_AA | | – | – | – |
| | | | BLK_A1.BLK_A2.I2_AA | | 0 | 0 | 0 |

33-1 LOGICAL PATH INFORMATION

FIG.19A

| MODULE NAME | CONNECTION CONDITION |
|---|---|
| BUF_A | OUT=IN |
| SEL_B | Y=(A1&A2)|(B1&B2) |

CONNECTION RELATIONSHIP LOGIC INFORMATION 32-2

FIG.19B

| CONNECTION CONDITION | CONNECTION ORIGINATOR POINT | CONNECTION DESTINATION POINT |
|---|---|---|
| none | P_IA | BLK_A1.BLK_A2.I2_AA |
| P_CNT[1:0]=2'b01 | P_IA | BLK_B1.BLK_B2.I2_BA |

CONNECTION SPECIFICATION 34-2

FIG.19C

| COUNT 1 | COUNT 2 | PATH SEARCH ORIGIN | ARRIVAL POINT | NEXT PATH SEARCH ORIGIN | PASSAGE FLAG | INVERSION FLAG | LOOP DETECTION FLAG |
|---|---|---|---|---|---|---|---|
| 0 | 0 | P_CNT[0] | SEL_B.A2 | | 0 | 0 | 0 |
| 1 | 0 | P_CNT[1] | SEL_B.B2 | | 0 | 0 | 0 |

LOGICAL PATH INFORMATION (LOGICAL CONDITION) 33a-2

FLAG INFORMATION 5f

FIG.19D

LOGICAL PATH INFORMATION (VERIFICATION TARGET) 33b-2

| COUNT 1 | COUNT 2 | PATH SEARCH ORIGIN | ARRIVAL POINT | NEXT PATH SEARCH ORIGIN | FLAG INFORMATION 5f ||| 
|---|---|---|---|---|---|---|---|
| | | | | | PASSAGE FLAG | PASSAGE INVERSION FLAG | LOOP DETECTION FLAG |
| 0 | 0 | P_IA | BUF_A.IN | BUF_A.OUT | 1 | 0 | 0 |
| | 1 | BUF_A.OUT | SEL_B.A1 | SEL_B.Y | 1 | 0 | 0 |
| | 2 | SEL_B.Y | BLK_A1.I1_AA | — | — | — | 1 |
| | | | (BLK_A1.BLK_A2.I2_AA) | — | 0 | 0 | 0 |
| | | | BLK_B1.I1_BA | — | — | — | 1 |
| | | | (BLK_B1.BLK_B2.I2_BA) | — | 0 | 0 | 0 |

FIG.20A

| MODULE NAME | CONNECTION CONDITION |
|---|---|
| BUF_A | OUT=IN |
| SEL_B | Y=A1,Y=A2,Y=B1,Y=B2 |
| BLK_A2 | O2_AA=I2_AA, O2_AA=I2_AB |
| BLK_A3 | O3_AA=I3_AA, O3_AB=I3_AA |
| BLK_B2 | O2_BA=I2_BA |
| BLK_B3 | O3_BA=I3_BA, O3_BB=I3_BA |

CONNECTION RELATIONSHIP LOGIC INFORMATION 32-3

FIG. 20B

| COUNT 1 | COUNT 2 | PATH SEARCH ORIGIN | ARRIVAL POINT | NEXT PATH SEARCH ORIGIN | PASSAGE FLAG | INVERSION FLAG | LOOP DETECTION FLAG |
|---|---|---|---|---|---|---|---|
| 0 | 0 | P_IA | BUF_A.IN | BUF_A.OUT | 1 | 0 | 0 |
|  | 1 |  | SEL_B.A1 | SEL_B.Y | 1 | 0 | 0 |
|  |  | BUF_A.OUT | BLK_A1.I1_AA | — | — | — | — |
|  | 2 |  | BLK_A1.BLK_A2.I2_AA | BLK_A1.BLK_A2.O2_AA | 1 | 0 | 0 |
|  |  |  | BLK_A1.BLK_A3.I3_AA | BLK_A1.BLK_A3.O3_AA | 1 | 0 | 0 |
|  | 3 | BLK_A1.BLK_A2.O2_AA | BLK_A1.O1_AA | BLK_A1.BLK_A3.O3_AB | 1 | 0 | 0 |
|  |  |  | P_OA |  | 0 | — | — |
|  | 4 | BLK_A1.BLK_A3.O3_AB | BLK_A1.BLK_A2.I2_AB | BLK_A1.BLK_A2.O2_AA | 1 | 0 | 1 |
|  | 5 | SEL_B.Y | BLK_B1.I1_BA | — | 1 | — | — |
|  | 6 |  | BLK_B1.BLK_B2.I2_BA | BLK_B1.BLK_B2.O2_BA | 1 | 0 | 0 |
|  |  |  | BLK_B1.BLK_B3.I3_BA | BLK_B1.BLK_B3.O3_BA | 1 | 0 | 0 |
|  | 7 | BLK_B1.BLK_B2.O2_BA | BLK_B1.O1_BA | BLK_B1.BLK_B3.O3_BB | 1 | 0 | 0 |
|  |  |  | P_OB |  | 0 | — | — |
|  | 8 | BLK_B1.BLK_B3.O3_BB | BLK_B1.O1_BB | SEL_B.Y | 1 | 0 | 1 |
|  |  |  | SEL_B.B1 |  | 1 | 0 | 1 |

FLAG INFORMATION 5f

LOGICAL PATH INFORMATION 33-3

FIG.20C

| COUNT 1 | COUNT 2 | PATH SEARCH ORIGIN | ARRIVAL POINT | NEXT PATH SEARCH ORIGIN | FLAG INFORMATION 5f | | LOOP DETECTION FLAG |
|---|---|---|---|---|---|---|---|
| | | | | | PASSAGE FLAG | INVERSION FLAG | |
| 0 | 1 | BUF_A.OUT | BLK_A1.BLK_A2.I2_AA | BLK_A1.BLK_A2.O2_AA | 1 | 0 | 0 |
| | 2 | BLK_A1.BLK_A2.O2_AA | BLK_A1.BLK_A3.I3_AA | BLK_A1.BLK_A3.O3_AB | 1 | 0 | 0 |
| | 4 | BLK_A1.BLK_A3.O3_AB | BLK_A1.BLK_A2.I2_AB | BLK_A1.BLK_A2.O2_AA | 1 | 0 | 1 |
| 0 | | P_IA | SEL_B.A1 | SEL_B.Y | 1 | 0 | 0 |
| | 5 | SEL_B.Y | BLK_B1.BLK_B2.I2_BA | BLK_B1.BLK_B2.O2_BA | 1 | 0 | 0 |
| | 6 | BLK_B1.BLK_B2.O2_BA | BLK_B1.BLK_B3.I3_BA | BLK_B1.BLK_B3.O3_BB | 1 | 0 | 0 |
| | 8 | BLK_B1.BLK_B3.O3_BB | SEL_B.B1 | SEL_B.Y | 1 | 0 | 1 |

LOOP DETECTION PATH INFORMATION
81-3

FIG.21A

| MODULE NAME | CONNECTION CONDITION |
|---|---|
| BUF_A | OUT=IN |
| SEL_B | Y=A1,Y=A2,Y=B1,Y=B2 |
| BLK_A2 | O2_AA=I2_AA, O2_AA=I2_AB |
| BLK_A3 | O3_AA=I3_AA, O3_AB=I3_AA |
| BLK_B2 | O2_BA=I2_BA |
| BLK_B3 | 3_BA=I3_BA, O3_BB=I3_BA |

CONNECTION RELATIONSHIP LOGIC INFORMATION 32-4

FIG.21B

| MODULE NAME | POWER DOMAIN |
|---|---|
| BUF_A | PD1 |
| SEL_B | PD1 |
| BLK_A2 | PD2 |
| BLK_A3 | PD2 |
| BLK_B2 | PD3 |
| BLK_B3 | PD3 |

POWER SPECIFICATION INFORMATION 36-4

FIG.21C

| COUNT 1 | COUNT 2 | PATH SEARCH ORIGIN | ARRIVAL POINT | NEXT PATH SEARCH ORIGIN | PASSAGE FLAG | INVERSION FLAG | LOOP DETECTION FLAG |
|---|---|---|---|---|---|---|---|
| 0 | 0 | P_IA | BUF_A.IN | BUF_A.OUT | 1 | 0 | 0 |
|   |   |   | SEL_B.A1 | SEL_B.Y | 1 | 0 | 0 |
|   | 1 | BUF_A.OUT | BLK_A1.I1_AA | – | – | – | – |
|   |   |   | BLK_A1.BLK_A2.I2_AA | – | 0 | 0 | 0 |
|   | 2 | SEL_B.Y | BLK_B1.I1_BA | – | – | – | – |
|   |   |   | BLK_B1.BLK_B2.I2_BA | – | 0 | 0 | 0 |
|   | 3 | P_CNT[0] | SEL_B.A2 | SEL_B.Y | 1 | 0 | 1 |
|   | 4 | P_CNT[1] | SEL_B.B2 | SEL_B.Y | 1 | 0 | 1 |
| 1 | 0 | BLK_A1.BLK_A2.O2_AA | BLK_A1.BLK_A3.O3_AA | BLK_A1.BLK_A3.AA | 1 | 0 | 0 |
|   |   |   | BLK_A1.BLK_A3.O3_AB | BLK_A1.BLK_A3.AB | 1 | 0 | 0 |
|   | 1 | BLK_A1.BLK_A3.O3_AA | BLK_A1.O1_AA | – | – | – | – |
|   |   |   | P_OA | – | 0 | 0 | 1 |
|   | 2 | BLK_A1.BLK_A3.O3_AB | BLK_A1.BLK_A2.I2_AA | BLK_A1.BLK_A2.AA | 1 | 0 | 0 |
| 2 | 0 | BLK_B1.BLK_B2.O2_BA | BLK_B1.BLK_B3.O3_BA | BLK_B1.BLK_B3.BA | 1 | 0 | 0 |
|   |   |   | BLK_B1.BLK_B3.O3_BB | BLK_B1.BLK_B3.BB | 1 | 0 | 0 |
|   | 1 | BLK_B1.BLK_B3.O3_BA | BLK_B1.O1_BA | – | – | – | – |
|   |   |   | P_OB | – | 0 | 0 | 1 |
|   | 2 | BLK_B1.BLK_B3.O3_BB | BLK_B1.O1_BB | – | – | – | – |
|   |   |   | SEL_B.B1 | – | 0 | 0 | 0 |

LOGICAL PATH INFORMATION 33-4

FLAG INFORMATION 5f

FIG.21D

| COUNT 1 | COUNT 2 | PATH SEARCH ORIGIN | ARRIVAL POINT | NEXT PATH SEARCH ORIGIN | PASSAGE FLAG | INVERSION FLAG | LOOP DETECTION FLAG |
|---|---|---|---|---|---|---|---|
| | | | | | \multicolumn{3}{c}{FLAG INFORMATION 5f} |
| 0 | 1 | BUF_A.OUT | BLK_A1.BLK_A2.I2_AA | | 0 | 0 | 0 |
| 2 | 2 | SEL_B.Y | BLK_B1.BLK_B2.I2_BA | | 0 | 0 | 0 |
| 2 | 2 | BLK_B1.BLK_B3.O3_BB | SEL_B.B1 | | 0 | 0 | 0 |

POWER DOMAIN BOUNDARY INFORMATION 82-4

CONNECTION VERIFICATION METHOD, RECORDING MEDIUM THEREOF, AND CONNECTION VERIFICATION APPARATUS

CROSS-REFERENCE TO RELATED APPLICATIONS

This patent application is based upon and claims the benefit of priority of the prior Japanese Patent Application No. 2010-245709 filed on Nov. 1, 2010, the entire contents of which are incorporated herein by reference.

FIELD

The embodiment discussed herein is related to a connection verification method, a recording medium thereof, and a connection verification apparatus, in which a connection between nodes in an integrated circuit is verified.

BACKGROUND

In a design of the integrated circuit, it is verified whether a circuit described in a hardware description language or the like is designed in accordance with a specification. In design verification, a path search is conducted based on connection information between modules, starting from a node being an origin. For example, it is provided to verify a correspondence between each input of circuit elements and a power source by an input port search based on the connection information of the circuit, and the like.

In the above-described conventional technology, the path search is conducted based on the connection information of the circuit from a verification target node. The path search can be conducted only for nodes related to the same node being the origin. Most circuits include logic gates such as a selector and the like in a middle of a path. Thus, the path search cannot be further conducted.

Moreover, in a design verification, there are one specification item which can be confirmed by an operation of a designed circuit and other specification item which cannot be confirmed by the operation of the designed circuit. The one specification item which can be confirmed by the operation influences a logical function, and the operation is verified by a functional verification using a simulation of whether the operation meets the one specification item. The other specification item which cannot be confirmed by the operation does not influence the logical function, and the connection verification is conducted to verify whether a connection relationship meets the another specification item. Mainly, the connection verification is conducted visually by a circuit designer. Thus, a large amount of time is consumed. In addition, due to an increase of a circuit scale, it becomes difficult for the circuit designer to visually conduct the connection verification.

SUMMARY

According to one aspect of the embodiment, there is provided a connection verification method performed in a computer, the method including verifying, by the computer, a connection between a first node and a second node by starting from the first node in a designed integrated circuit, based on connection information stored in a storage part; detecting, by the computer, whether a module connected to the second node is a predetermined module having a logic condition therein; and conducting, by the computer, a connection verification starting the module to verify a connection between the module and a third node when the module is the predetermined module.

Also, according to another aspect of the embodiment, there may be provided a non-transitory computer-readable recording medium recorded with a program which, when executed by a computer, causes the computer to perform a connection verification process, and a connection verification apparatus.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 4 is a flowchart for explaining a path search process in step S12 in FIG. 3;

FIG. 5A and FIG. 5B are flowcharts for explaining a final arrival point determination process in step S13 in FIG. 3;

FIG. 6A and FIG. 6B are flowcharts for explaining a first variation example of the final arrival point determination process;

FIG. 7A and FIG. 7B are flowcharts for explaining a second variation example of the final arrival point determination process;

FIG. 8A and FIG. 8B are flowcharts for explaining a third variation example of the final arrival point determination process;

FIG. 18A through FIG. 18C are diagrams illustrating data examples in a case of conducting the first application example illustrated FIG. 10A and FIG. 10B;

FIG. 19A through FIG. 19D are diagrams illustrating data examples in a case of conducting the second application example in FIG. 11;

FIG. 20A through FIG. 20C are diagrams illustrating data examples in a case of conducting the third application example in FIG. 12A and FIG. 12B; and FIG. 21A through FIG. 21D are diagrams illustrating data examples in a case of conducting a fifth application example illustrated in FIG. 15A and FIG. 15B.

DESCRIPTION OF EMBODIMENTS

In the following, embodiments of the present invention will be described with reference to the accompanying drawings. In a design verification of a semiconductor integrated circuit, when a logic gate such as a selector or the like is detected based on a logic analysis during a path search starting from a verification target node being an origin, the detected logic gate is set as a new origin to further conduct the path search. Therefore, a logical path can be searched in an extensive range. Also, in a path searched in the extensive range, connection verification and loop verification can be conducted. Thus, it is possible to realize the design verification of the semiconductor integrated circuit at higher precision.

Figure 1:
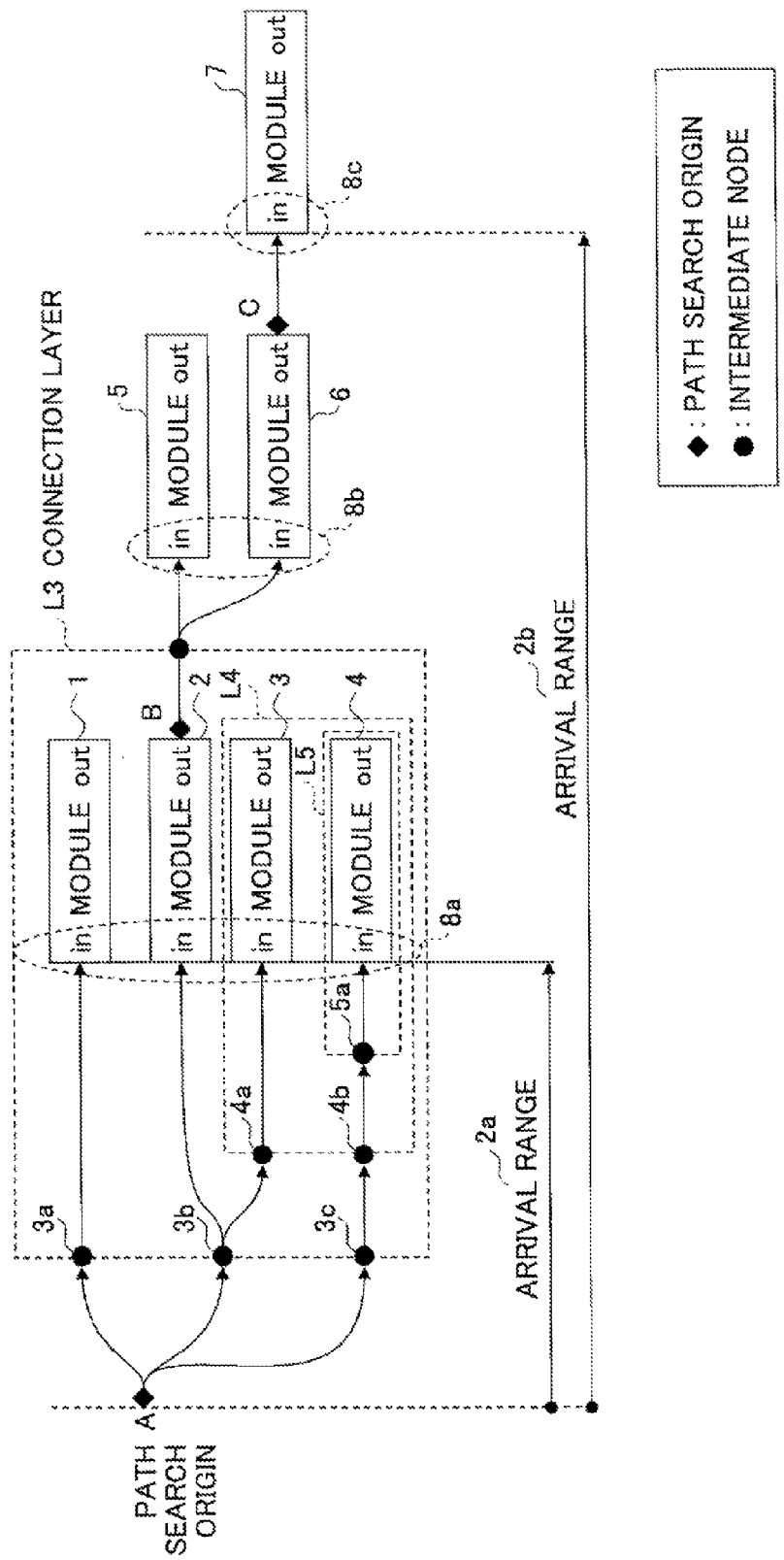
FIG. 1 is a schematic diagram for explaining a logical path search process according to an embodiment.

FIG. 1 is a schematic diagram for explaining the logical path search process according to an embodiment. By referring to an example of searching for the logical path in which a node A is set to be an origin of a path search in a module configuration in an integrated circuit illustrated in FIG. 1, a logical path search process according to the embodiment will be described. Hereinafter, the node A is called a path search origin A. In FIG. 1, the module configuration includes module 1 through module 7. In a connection layer L3 related to the logical path from the path search origin A, intermediate nodes 3a, 3b, and 3c exist, and module 1 and module 2 are arranged. In a connection layer L4, intermediate nodes 4a and 4b exist, and a module 3 is arranged. In a connection layer L5, an intermediate 5a exists, and a module 4 is arranged.

The logical path search process according to the embodiment is conducted as below.
1. First Path Search: the path search is begun from the path search origin A, and input terminals of the module 1 to module 4 in the connection layer L3 are detected as arrival points. If the logical path search process according to the embodiment is not applied, the logical path is searched within an arrival range 2a from the path search origin A to the input terminals of the module 1 to module 4. However, in the logical path search process according to the embodiment, the following processes are successively conducted.
2. Final Arrival Point Determination: it is determined whether the arrival point is a predetermined logic gate and whether a signal passes under a given logic condition. When it is determined that the signal passes, an output terminal of the module 2 is set to be a path search origin A, and the input terminals of the modules 1, 3, and 4 are defined as final arrival points 8a for the path search origin A in the first path search.

After that, a second path search is conducted.
3. Second Path Search: the path search is resumed from a path search origin B, and the input terminals of the modules 5 and 6 are detected as the arrival points.
4. Final Arrival Point Determination: it is determined whether the arrival point is the predetermined logic gate, and whether the signal passes under the given logic condition.

The output terminal of the module 6 is set to be a path search origin C, and the input terminal of the module 5 is defined to be final arrival point 8b for the path search origin B in the second path search.

Moreover, a third path search is conducted.
5. Third Path Search: the path search is resumed from a path search origin C, and the input terminal of the module 7 is detected.
6. Final Arrival Point Determination: it is determined whether the arrival point is the predetermined logic gate, and whether the signal passes under the given logic condition. The input terminal of the module 7 is defined as the final arrival point 8c in the third path search.

As described above, in a case in which the logical path search process according to the present invention is applied, the path search can be conducted wider than the arrival range 2a in the case in which the logical path search process according to the present invention is not applied.

That is, the logical path is searched in a arrival range 2b from the path search origin A to the input terminal of the module 7.

Figure 2:
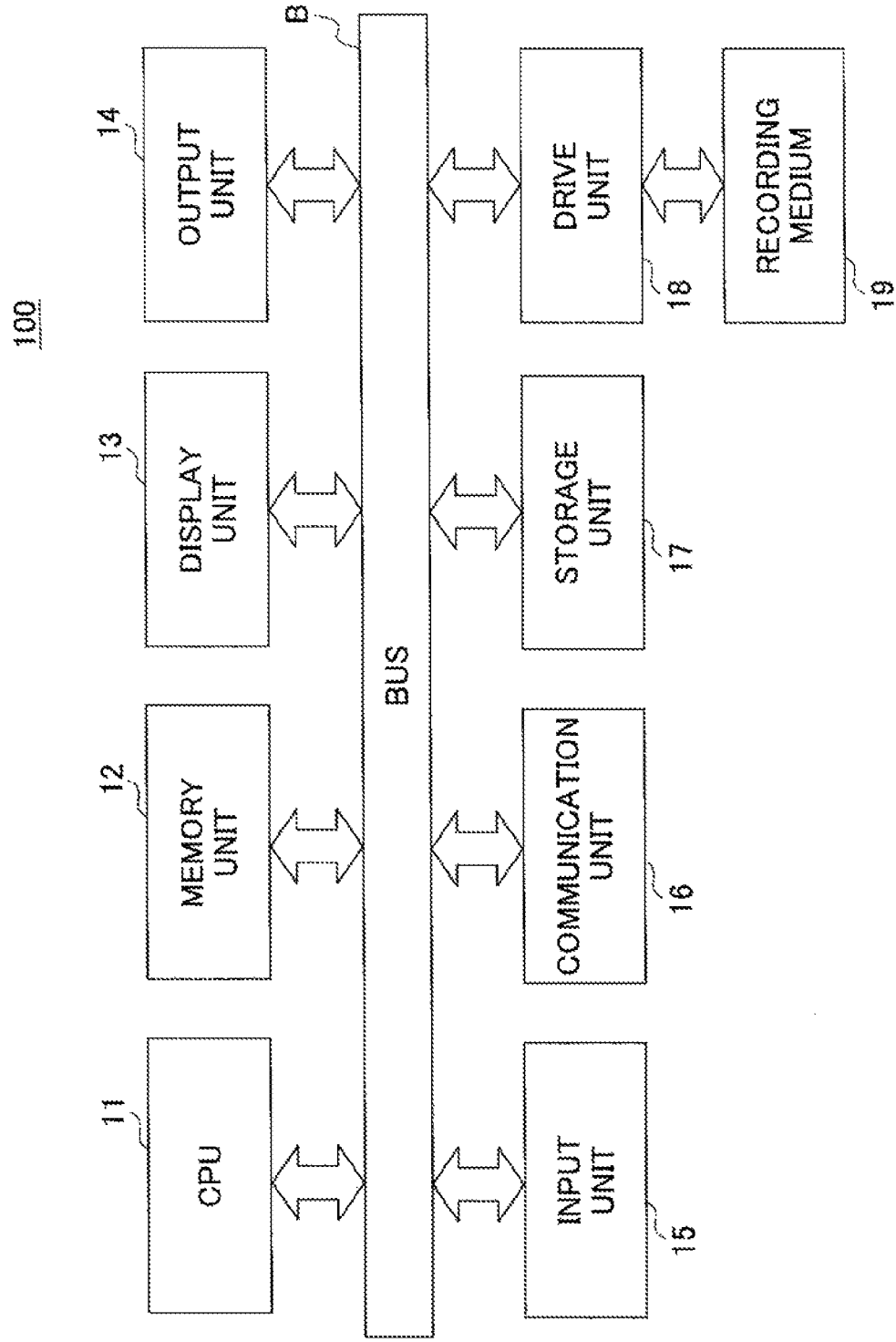
FIG. 2 is a block diagram illustrating a hardware configuration of a design verification apparatus.

A design verification apparatus 100 for verifying an integrated circuit according to the embodiment, in which the logical path search process as described above is executed, and the connection verification, a loop verification, and the like are conducted by using an execution result of the logical path search process, has a hardware configuration as illustrated in FIG. 2. FIG. 2 is a block diagram illustrating the hardware configuration of the design verification apparatus 100.

In FIG. 2, the design verification apparatus 100 is used as a terminal controlled by a computer, and includes a processor such as a CPU (Central Processing Unit) 11, a memory unit 12, a display unit 13, an output unit 14, an input unit 15, a communication unit 16, a storage unit 17, and a drive unit 18, which are mutually connected via a system bus B.

The CPU 11 controls the design verification apparatus 100 in accordance with a program stored in the memory unit 12. For the memory unit 12, a RAM (Random Access Memory), a ROM (Read Only Memory), and the like may be used to store programs executed by the CPU 11, data necessary for processes conducted by the CPU 11, data acquired in the processes conducted by the CPU 11, and the like. Moreover, a part of an area of the memory unit 12 is assigned as a working area used in the process by the CPU 11.

The display unit 13 displays various necessary information items under a control of the CPU 11. The output unit 14 includes a printer and the like, and is used to output various information items in response to an instruction of a user who may be an integrated circuit designer. The input unit 15 includes a mouse, a keyboard, and the like, and is used by the user to input various necessary information items for the design verification apparatus 100 to conduct the processes. For example, the communication unit 16 connects the Internet, a LAN (Local Area Network), and the like, and controls communications with an external device. For example, a hard disk unit may be used for the storage unit 17, and stores data, programs to conduct various processes, and the like.

For example, a program realizing a process, which is executed by the design verification apparatus 100, is provided to the design verification apparatus 100 by a recording medium 19 such as a CD-ROM (Compact Disc Read-Only Memory) or the like. For example, the recording medium 19 may be formed by a non-transitory (or tangible) computer-readable recording medium. When the recording medium 19 storing the program is set in the drive unit 18, the program is read out by the drive unit 18 from the recording medium 19, and is installed into the storage unit 17 via the system bus B.

When the CPU 11 is instructed to execute the program, the program is read from the storage unit 17 and stored in the memory unit 12, and the CPU 11 conducts the process in accordance with instructions of the program stored in the memory unit 12. A medium is not limited to the CD-ROM to store the program. Any computer-readable medium can be used. For example, a portable recording medium such as a DVD (Digital Versatile Disk), a USB (Universal Serial Bus) memory, a semiconductor memory such as a flash memory, or the like may be used, as well as the CD-ROM.

Also, the program realizing the process, which is executed by the design verification apparatus 100, may be provided from the external device via the communication unit 16. Alternatively, the program may be provided to the external device, each of processes described later may be conducted by the external device. The communication unit 16 is not limited to a wireless communication or a wired communication.

Figure 3:
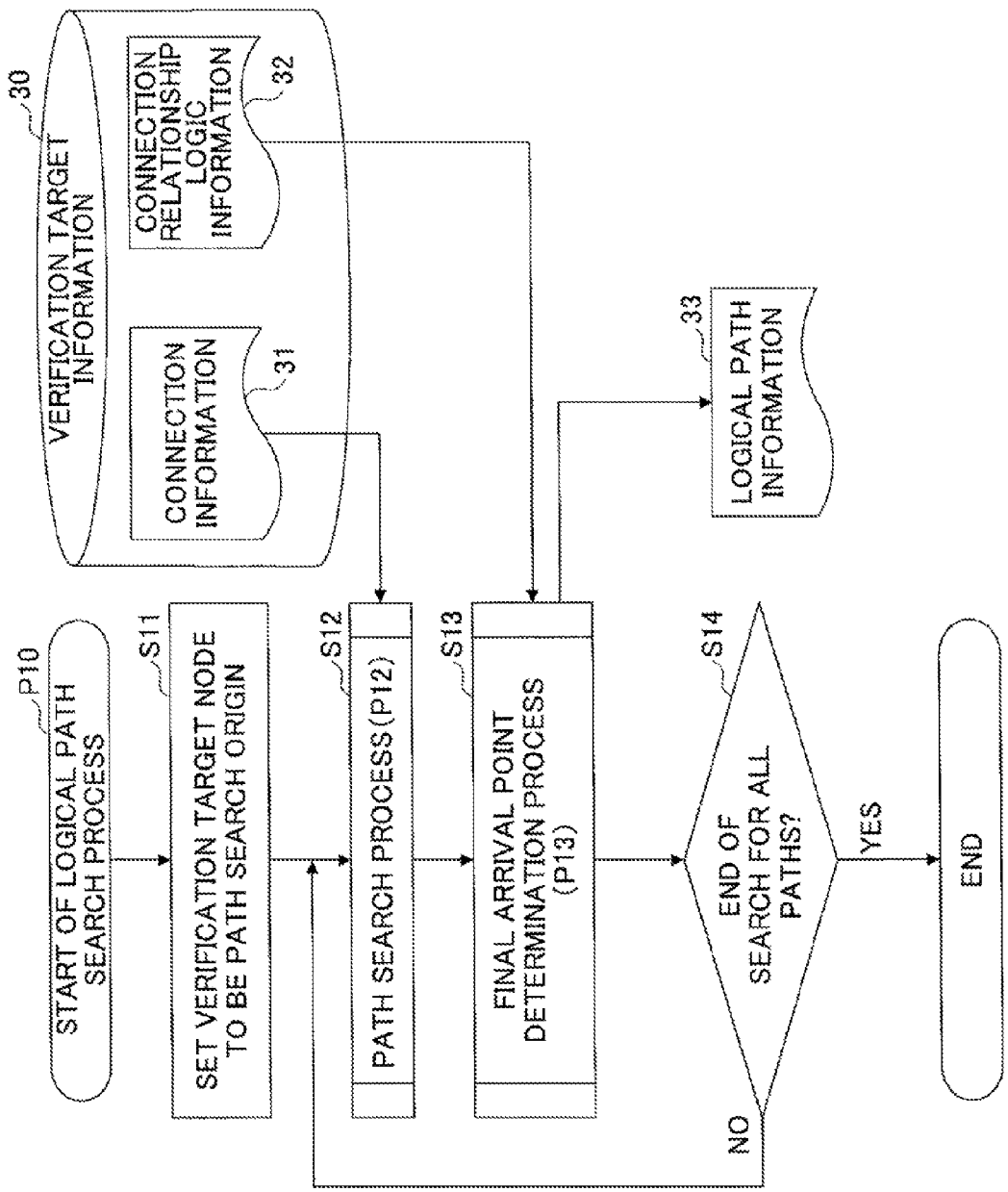
FIG. 3 is a flowchart for explaining the logical path search process.

FIG. 3 is a flowchart for explaining the logical path search process. In FIG. 3, verification target information 30 is stored in the memory unit 12 or/and the storage unit 17 (hereinafter, called a storage part) and includes connection information 31, and connection relationship logic information 32.

The connection information 31 indicates a connection relationship between modules. For example, the connection information 31 may be regarded as a hardware model (verilog model) described in a hardware description language, a netlist created by software such as a SPICE (Simulation Program with Integrated Circuit Emphasis) or the like. The connection relationship logic information 32 includes logic information related to logic gates in a connection path. For example, if using the verilog model, the connection information 31 and the connection relationship logic information 32 are included in the verification target information 30.

When the CPU 11 is instructed to start a logical path search process P10, the CPU 11 sets a verification target node to be a path search origin (step S11). Then, the CPU 11 executes a path search process P12 by referring to the connection information 31 of the verification target information 30 (step S12), and conducts a final arrival point determination process P13 by referring to the connection relationship logic information 32 of the verification target information 30 (step S13). Logical path information 33 is output to be stored in the storage part in the final arrival point determination process P13.

After that, the CPU 11 determines whether all paths are searched (step S14). When all paths are not searched, the CPU 11 goes back to the step S12 to repeat the above-described steps. On the other hand, when all paths are searched, the CPU 11 terminates the logical path search process P10.

As described above, the path search process P12 (step S12) is a process conducted by the CPU 11 executing a respective program. The path search process P12 extracts a node (connection node). If the extracted connection node is regarded as an input to a module, a connection node is searched within each module and the connection node is extracted in the entire connection layer to be a target. Also, the path search process P12 extracts the arrival point by excluding intermediate nodes, which exist in a path from the extracted connection node.

The final arrival point determination process P13 (step S13) is a process conducted by the CPU 11 executing a respective program. The final arrival point determination process P13 determines whether a module includes a logically connected path in which the input terminal is logically connected with the output terminal, with respect to each of modules at the arrival points specified in the path search process P12 (step S12). If the logically connected path exists in the module, the final arrival point determination process P13 defines the output terminal as a new path search origin. That is, when it is determined that the module to be the new path search origin exists, by referring to the logical path information 33 output from the final arrival point determination process P13, the module is defined as the path search origin for a verification target. Accordingly, a further path search can be realized through the module by conducting the path search process P12 and the final arrival point determination process P13.

FIG. 4 is a flowchart for explaining the path search process in the step S12 in FIG. 3. In the path search process P12 illustrated in FIG. 4, the CPU 11 extracts the nodes (connection nodes) having the connection relationship with the verification target node from the connection information 31, regardless of a connection layer (step S121). Then, the CPU 11 specifies a module of a lowest layer regarded as the input to the module, from the connection information 31 related to the extracted connection node (step S122). More than one module is specified as the arrival point. The CPU 11 outputs and stores the verification target nodes to be the path search origin, and input terminal identification for identifying the input terminal of more than one module connected from the verification target node as the arrival point, in an arrival point candidate list 5m in the storage part.

In the following, the final arrival point determination process in the step S13 in FIG. 3, which determines whether the specified arrival point is the final arrival point, will be described.

Figure 5A:
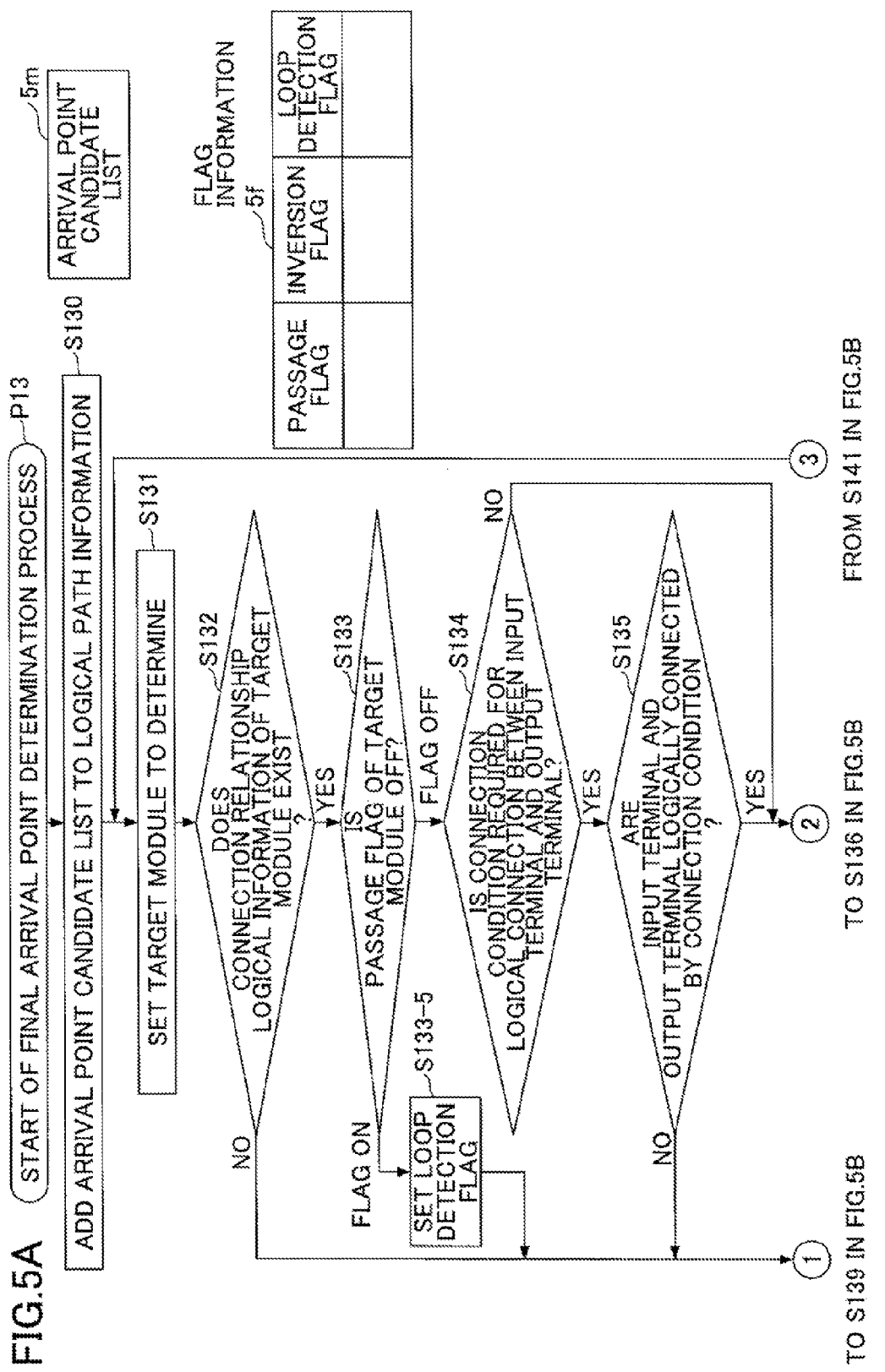

FIG. 5A and FIG. 5B are flowcharts for explaining the final arrival point determination process in the step S13 in FIG. 3. In the final arrival point determination process P13 illustrated in FIG. 5, the CPU 11 adds the path search origin and input information for each of the arrival points corresponding to the path search origin to the logical path information 33, by referring to the arrival point candidate list 5m (step S130).

After that, the CPU 11 sequentially acquires a module identification of a module to be the arrival point corresponding to the path search origin from the logical path information 33, and defines the module to be a target module which is determined in the final arrival point determination process P13 (step S131).

The CPU 11 refers to the verification target information 30, and determines whether the connection relationship logic information 32 exists for the target module (step S132). If the connection relationship logic information 32 does not exist, the CPU 11 defines the target module to be the final arrival point (step S139), and advances to step S140.

On the other hand, in the step S132, if it is determined that the connection relationship logic information 32 exists, the CPU 11 refers to flag information 5f managed in the logical path information 33, and determines whether a passage flag of the target module indicates OFF (step S133). When the passage flag of the target module indicates OFF, the CPU 11 determines that the target module is looped. The CPU 11 sets ON to the loop detection flag of the flag information 5f (step S133-5), defines the target module to be the final arrival point (step S139), and advances to step S140.

On the other hand, in the step S133, when the passage flag of the target module indicates OFF, the CPU 11 determines whether a connection condition is required for a logic connection between the input terminal and the output terminal of the target module, by referring to the connection relationship logic information 32 (step S134). When the connection condition is not required for the logic connection, the CPU 11 advances to step S136. When the connection condition is required for the logic connection, the input terminal and the output terminal of the target module are logically connected under a connection condition (step S135). When the CPU 11 determines that the input terminal and the output terminal of the target module are not logically connected, the CPU 11 defines the target module to be the final arrival point (step S139), and advances to the step S140.

On the other hand, in the step S135, when the CPU 11 determines that the input terminal and the output terminal of the target module are logically connected, the CPU 11 further determines whether the logic connection forms an inversion logic (step S136). When the logic connection does not form an inversion logic, the CPU 11 defines the output terminal of the target module having the connection relationship to be a new path search origin, and sets the passage flag of the flag information 5f to be ON (step S138).

On the other hand, in the step S138, the CPU 11 sets the inversion flag of the flag information 5f to be ON (step S137). However, if the inversion flag of the flag information 5f has been already ON, the CPU 11 resets the inversion flag to be OFF. After that, the CPU 11 acquires output terminal identification for identifying the output terminal of the target module having a logic connection for a next path search origin, and sets the passage flag of the flag information 5f (step S138).

The CPU 11 updates the logical path information 33 in accordance with the logical path related to the target module acquired in the above-described process (step S140). In a case in that the step S138 is executed, the CPU 11 sets the next path search point acquired in the step S138 by corresponding to the target module in the logical path information 33.

After that, the CPU 11 determines whether all modules to be the arrival points from the same path search origin are determined, by referring to the logical path information 33 (step S141). When all modules are not determined, the CPU 11 goes back to the step S131 and conducts the above-described process to determine a next module. On the other hand, when all modules are determined, the CPU 11 terminates the final arrival point determination process P13.

Next, various variations of the final arrival point determination process P13 will be described. FIG. 6A and FIG. 6B are flowcharts for explaining a first variation of the final arrival point determination process P13-1. In FIG. 6A and FIG. 6B, steps which are the same as those in FIG. 5A and FIG. 5B are indicated by the same reference numerals and the explanation thereof will be omitted. In the first variation of the final arrival point determination process P13-1 illustrated in FIG. 6A, the step S132 and the step S133 in FIG. 5A are swapped. Step S132-2 in FIG. 6A corresponds to a determination process for the passage flag of the target module in the step S133 in FIG. 5A. Also, step S133-2 in FIG. 6A corresponds to a determination process for determining a presence or absence of the connection relationship logic information 32 of the target module in the step S132 in FIG. 5A. Other steps are the same as those illustrated in FIG. 5A.

FIG. 7A and FIG. 7B are flowcharts for explaining a second variation of the final arrival point determination process P13-1. In FIG. 7A and FIG. 7B, steps which are the same as those in FIG. 6A and FIG. 6B are indicated by the same reference numerals and the explanation thereof will be omitted. In the second variation of the final arrival point determination process P13-1, the step S134 in FIG. 5A is omitted in the flowchart in FIG. 7A. Other steps are the same as those illustrated in FIG. 5A. For a case in which only buffers and inverters are connected, the step S134 for determining whether a connection condition is required for the logic connection can be omitted.

Figure 8A:
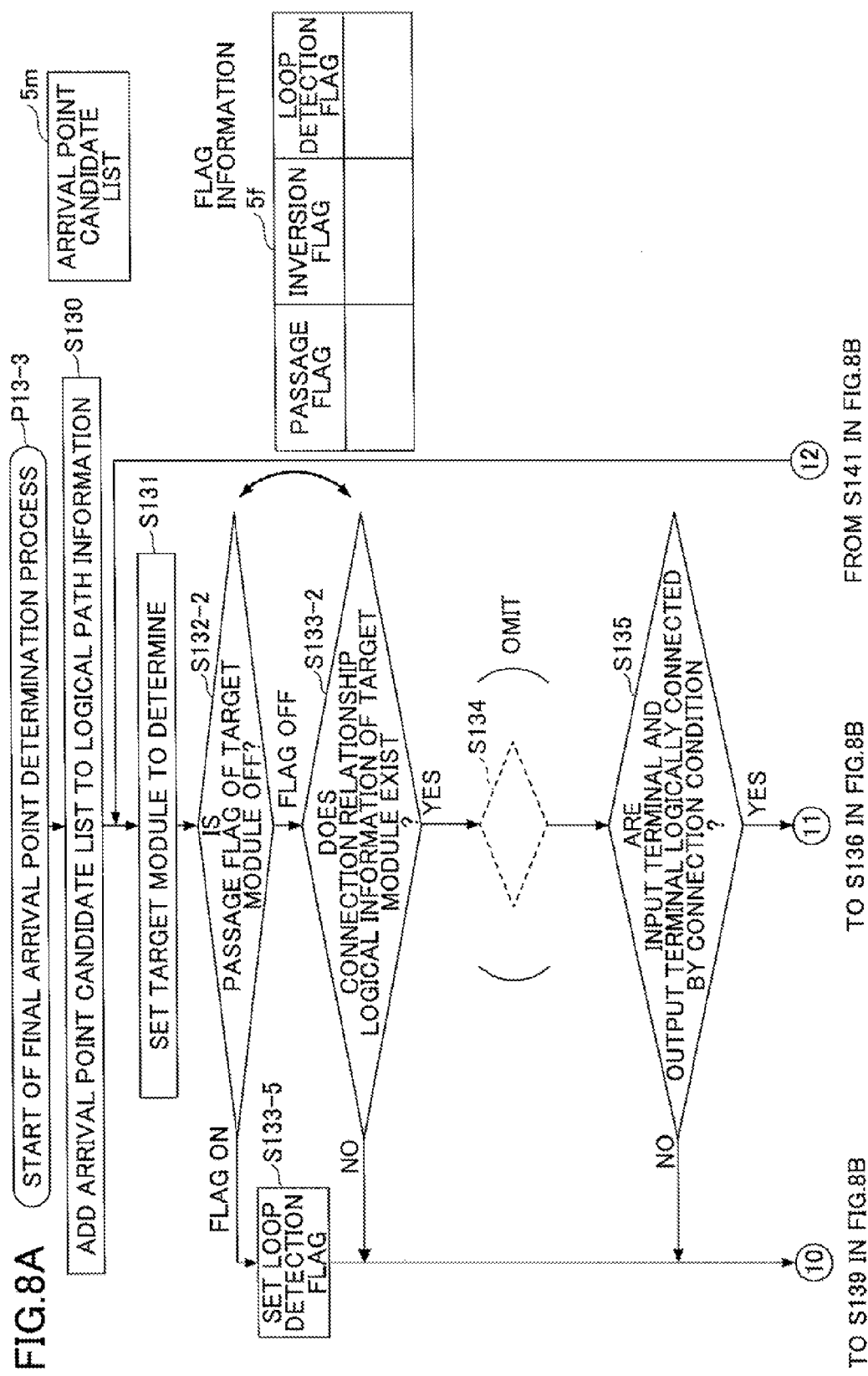

FIG. 8A and FIG. 8B are flowcharts for explaining a third variation of the final arrival point determination process P13-3. In FIG. 8A and FIG. 8B, steps which are the same as those in FIG. 5A and FIG. 5B are indicated by the same reference numerals and the explanation thereof will be omitted. In the third variation of the final arrival point determination process P13-3 illustrated in FIG. 8, the steps S132 and S133 in FIG. 5A are swapped, and the step S134 in FIG. 5A is omitted. Other steps are the same as those illustrated in FIG. 5A.

In the following, application examples, in which the above-described logical path search process P13 is applied will be described.

Figure 9:
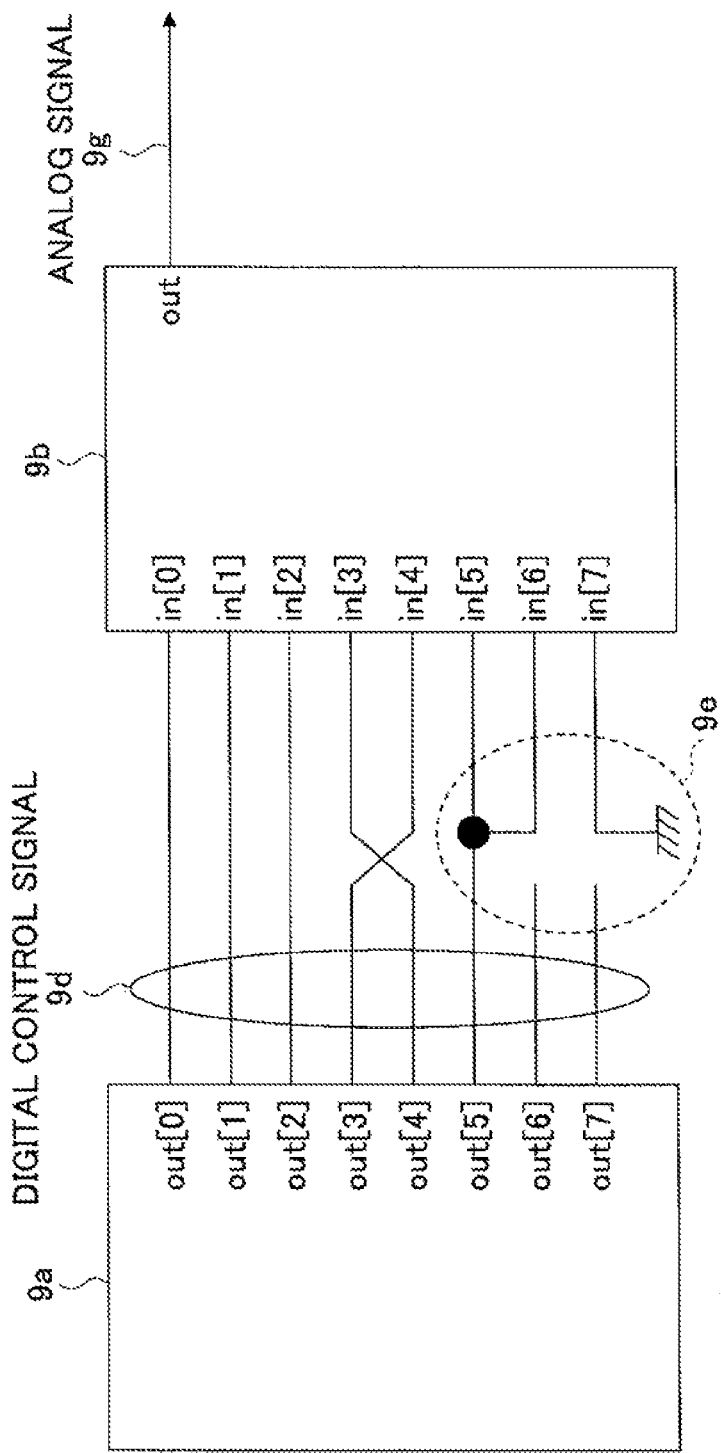
FIG. 9 is a diagram for explaining an example of a connection error.

It is difficult to detect a connection error in an operation verification. For example, as illustrated in FIG. 9, in a configuration in which a circuit 9a outputs a digital control signal 9d, which adjusts an analog characteristic, to a circuit 9b for outputting an analog signal 9g, even if a connection error 9e exists between the circuit 9a and the circuit 9b, an output logic of the circuit 9b may not change. In this case, it is difficult for a simulation (for example, a Verilog simulation) in a regular hardware description language. First, a connection verification process, which can detect the connection error by applying the logical path search process, will be described in a first application example and a second application example.

[First Application Example]

Figure 10A:
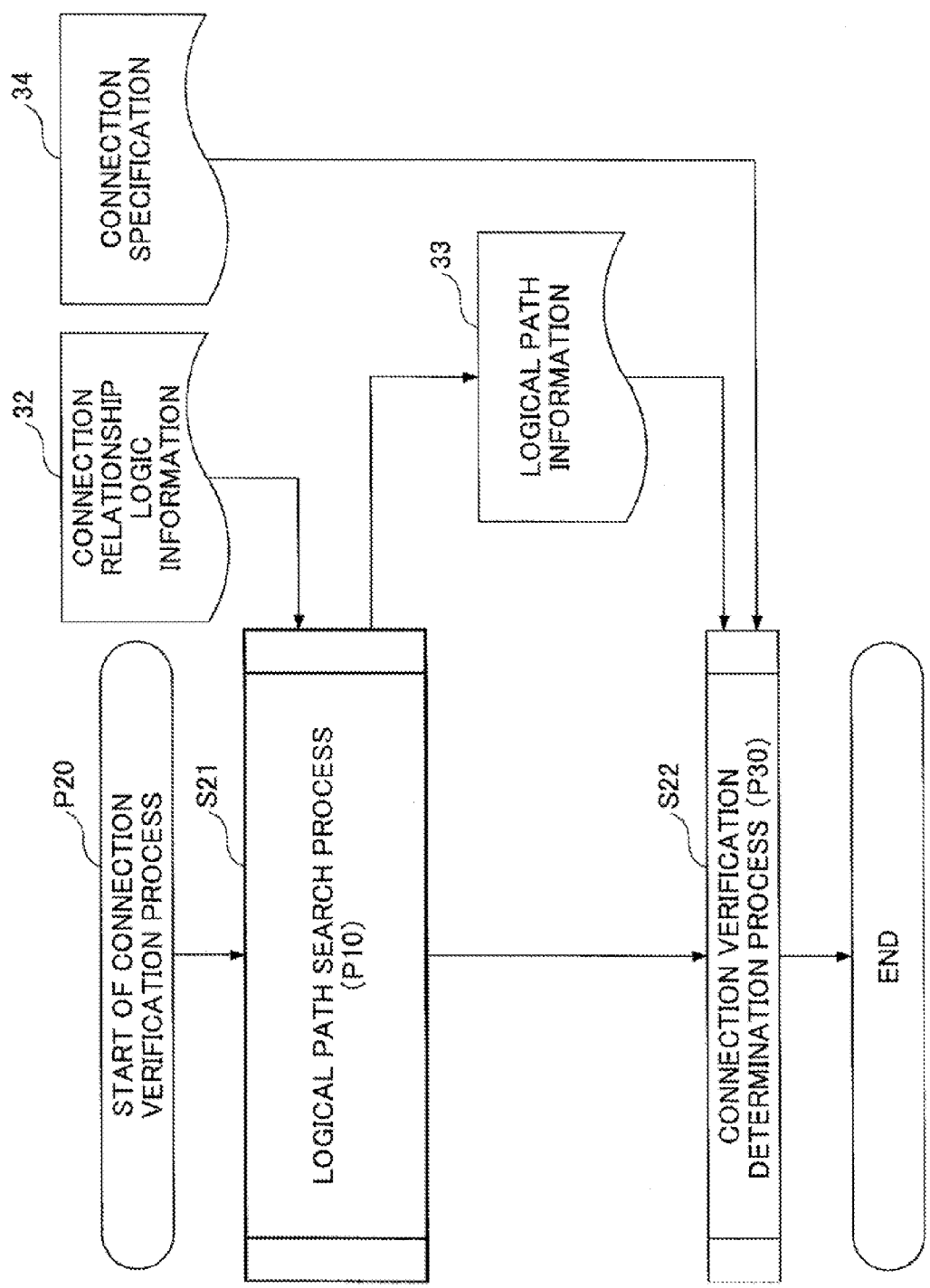
FIG. 10A and FIG. 10B are flowcharts for explaining a connection verification process in a case of not requiring a logic condition in a first application example of the logical path search process.
Figure 10B:
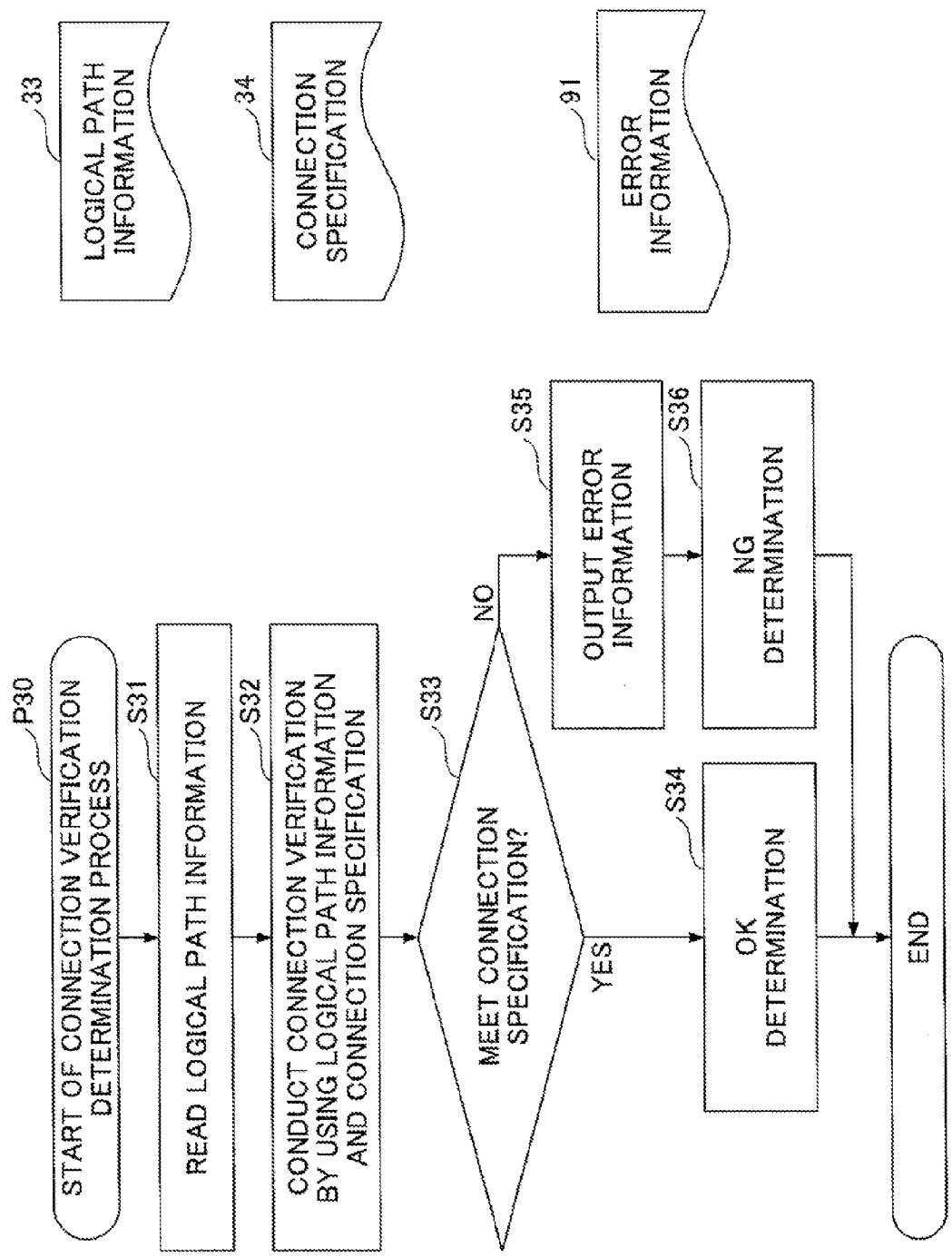

A connection verification process, in which a connection condition for the input terminal and the output terminal of a searched circuit is not a logic condition, will be described. FIG. 10A and FIG. 10B are flowcharts for explaining the connection verification process in a case in which the connection condition is not the logic condition, in a first application example of the logical path search process. A connection verification process P20 illustrated in FIG. 10A is conducted by the CPU 11 executing a respective program, for a circuit designed based on a connection specification in which the logic condition is not required. That is, the first application example of the logical path search process is applied to a circuit in which a path is formed via modules (logic gates) not requiring a condition for the logic connection, such as an AND circuit, an OR circuit, an INV circuit, and the like.

In connection relationship logic information 32, the connection condition related to the logic gate included in the logical path is recorded for each module. The connection relationship logic information 32 is stored beforehand in the storage part. The connection condition indicates one of information indicating that the input terminal and the output terminal having a logical relationship in the module are logically connected without a logic condition, the logic condition for logically connecting the input terminal and the output terminal. A meaning that "the logic condition is not required" indicates that the input terminal and the output terminal are logically connected without the logic condition. In the connection verification process, only logic gates included in the path in the searched module are referred to.

A connection specification 34 may is regarded as information indicating a specification between a connection originator and a connection destination to propagate a data signal, and is stored beforehand in the storage part. If the logic condition related to propagation of the data signal is required between a connection originator point and a connection destination point, the logic condition is indicated in the connection specification 34.

In the connection verification process P20 for a case not requiring the logic condition, items below are assumed.
    search signal: a data signal is used.
    control signal: not used.
    logic condition: the input terminal and the output terminal having the logical relationship are logically connected without the logic condition. A target is limited to a logic gate which is included in the path and does not require the logic condition.

In the connection verification process P20, the CPU 11 refers to the connection relationship logic information 32 limiting to the logic gate which is included in the path and does not require the logic condition, and the connection specification 34 related to the module of the input terminal and the output terminal for which the logic condition is required.

In the connection verification process P20, the CPU 11 executes the logical path search process P10 (step S21). Then, the CPU 11 executes a connection verification determination process P30 for conducting the connection verification by comparing each of the arrival points indicated in the logical path information 33 acquired in the logical path search process P10 with the connection destination point indicated in the connection specification 34 (step S22). After that, the CPU 11 terminates the connection verification process P20.

The connection verification determination process P30 in the step S22 in FIG. 10A will be described with reference to FIG. 10B. In FIG. 10B, the CPU 11 starts the connection verification determination process P30, and reads the logical path information 33 (step S31). Then, the CPU 11 conducts the connection verification by using the logical path information 33 and the connection specification 34 (step S32).

The CPU 11 determines whether a result of the connection verification meets the connection relationship indicated by the connection specification 33 (step S33). When the result of the connection verification meets the connection relationship indicated by the connection specification 33, the CPU 11 determines that the logical path detected by the logical path search process P10 is designed in accordance with the connection relationship indicated by the connection specification 34 (step S34). Then, the CPU 11 terminates the connection verification determination process P30. In the step S33, the CPU 11 may display, at the display unit 13, and notify to the circuit designer in a message indicating that the logical path between modules is designed in accordance with the connection relationship indicated by the connection specification 34.

On the other hand, in the step S34, when the result of the connection verification does not meet the connection relationship indicated by the connection specification 33, the CPU 11 output and stores error information 91 which includes an inconsistent logical path and a corresponding connection relationship indicated by the connection specification 34, to the storage part (step S35). The CPU 11 determines that the logical path detected in the logical path search process P10 fails to be designed in accordance with the connection relationship indicated by the connection specification 34 (step S36). Then, the CPU 11 terminates the connection verification determination process P30. In the step S36, the CPU 11 may display, at the display unit 13, and notify to the circuit designer in a message indicating that the logical path between modules fails to be designed in accordance with the connection relationship indicated by the connection specification 34.

[Second Application Example]

Figure 11:
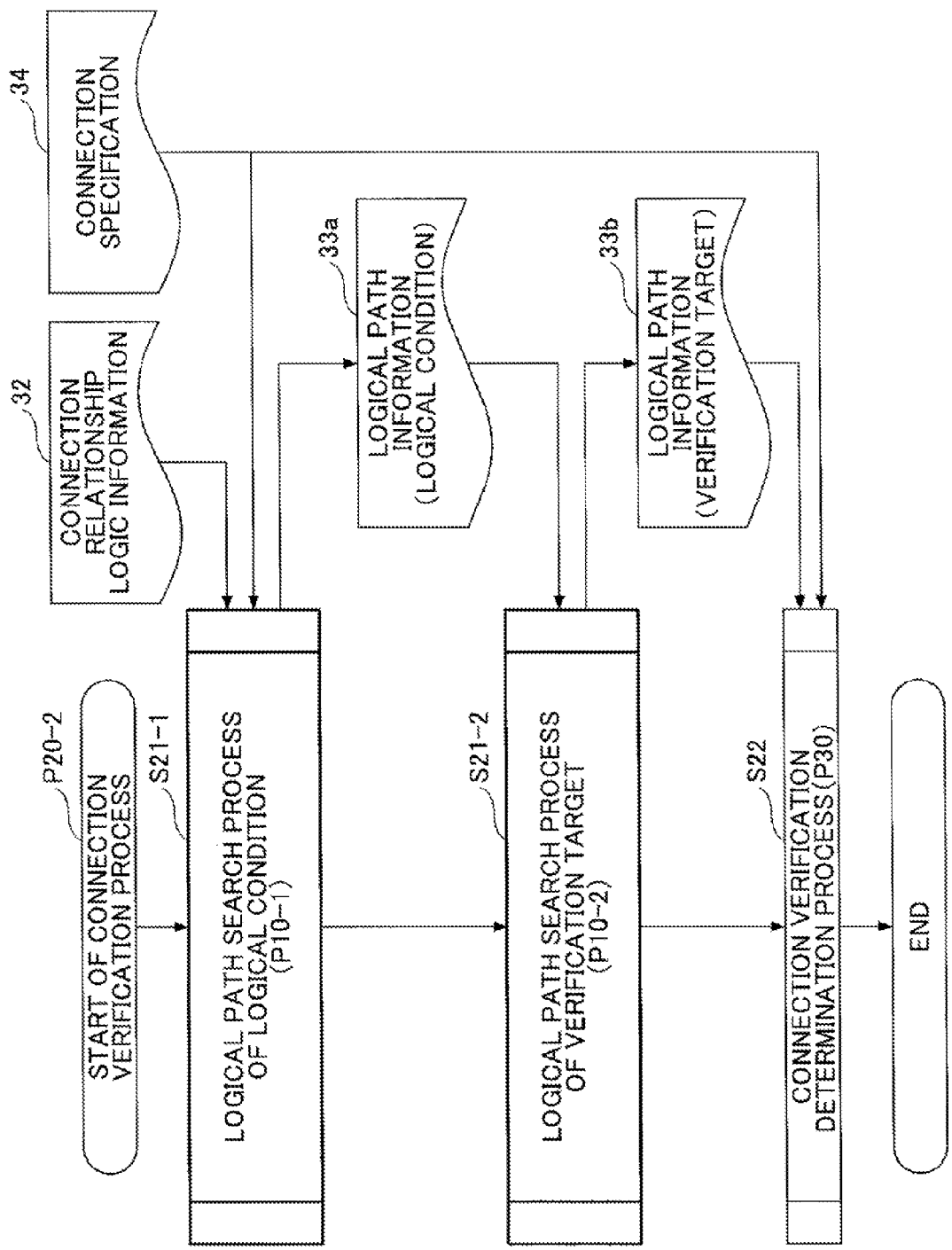
FIG. 11 is a flowchart for explaining the connection verification process in a case of requiring the logic condition in a second application example of the logical path search process.

Next, the connection verification process in a case in which the connection condition of the input terminal and the output terminal of a searched module indicates the logic condition will be described. FIG. 11 is a flowchart for explaining another connection verification process in which the logic condition is indicated, in a second application example of the logical path search process. A connection verification process P20-2 illustrated in FIG. 11 is conducted by the CPU 11 executing a respective program, and is regarded as a process targeting a module in accordance with the connection specification indicating the logic condition. That is, the connection verification process P20-2 can be applied in the connection verification for a module via the logic gate requiring a condition for the logic connection.

In the connection verification process P20-2 for a case not requiring the logic condition, items below are assumed.
    search signal: the data signal is used.
    control signal: a selector control signal is used.
    logic condition: the input terminal and the output terminal having the logical relationship are logically connected without the logic condition. A target is limited to the logic gate which is included in the path.

In the connection verification process P20-2, the connection relationship logic information 32, which includes information indicating the logic condition for logically connecting the input terminal and the output terminal having the logical relationship in the module, is referred to. The connection specification 34, which includes information of the input terminal and the output terminal for which the logic condition is indicated in the connection condition, is referred to.

In the connection verification process P20-2, the CPU 11 refers to the connection relationship logic information 32 and the connection specification 34, and conducts a logical path search process P10-1 related to the logic condition (step S21-1). By conducting the logical path search process P10-1 related to the logic condition, logical path information 33a related to the logic condition is output and stored in the storage part.

After that, the CPU 11 refers to the logical path information 33a related to the logic condition acquired in the logical path search process P10-1 related to the logic condition, the connection relationship logic information 32, and the connection specification 34, and conducts a logical path search process P10-2 (step S21-2). By conducting the logical path search process P10-2 for a verification target, logical path information 33b of the verification target is output and stored in the storage part.

Next, the CPU 11 conducts the connection verification determination process P30 by using the logical path information 33b of the verification target (step S22). Instead of the logical path information 33, the logical path information 33b of the verification target is used, and a connection verification determination process P30 illustrated in FIG. 10A is conducted. After that, the CPU 11 terminates the connection verification process P20-2.

Next, a loop path detection process to which the logical path search process is applied, will be described as a third application example and a fourth application example.

[Third Application Example]

The loop path detection process for detecting all loop paths will be described. In the third application example, in order to detect all loop paths, the logic information of an FF (Flip Flop) and the like is replaced with a logic representing passing through, and it is determined whether a path is returned to the same node. By this replacement and determination, all loop paths are detected.

Figure 12A:
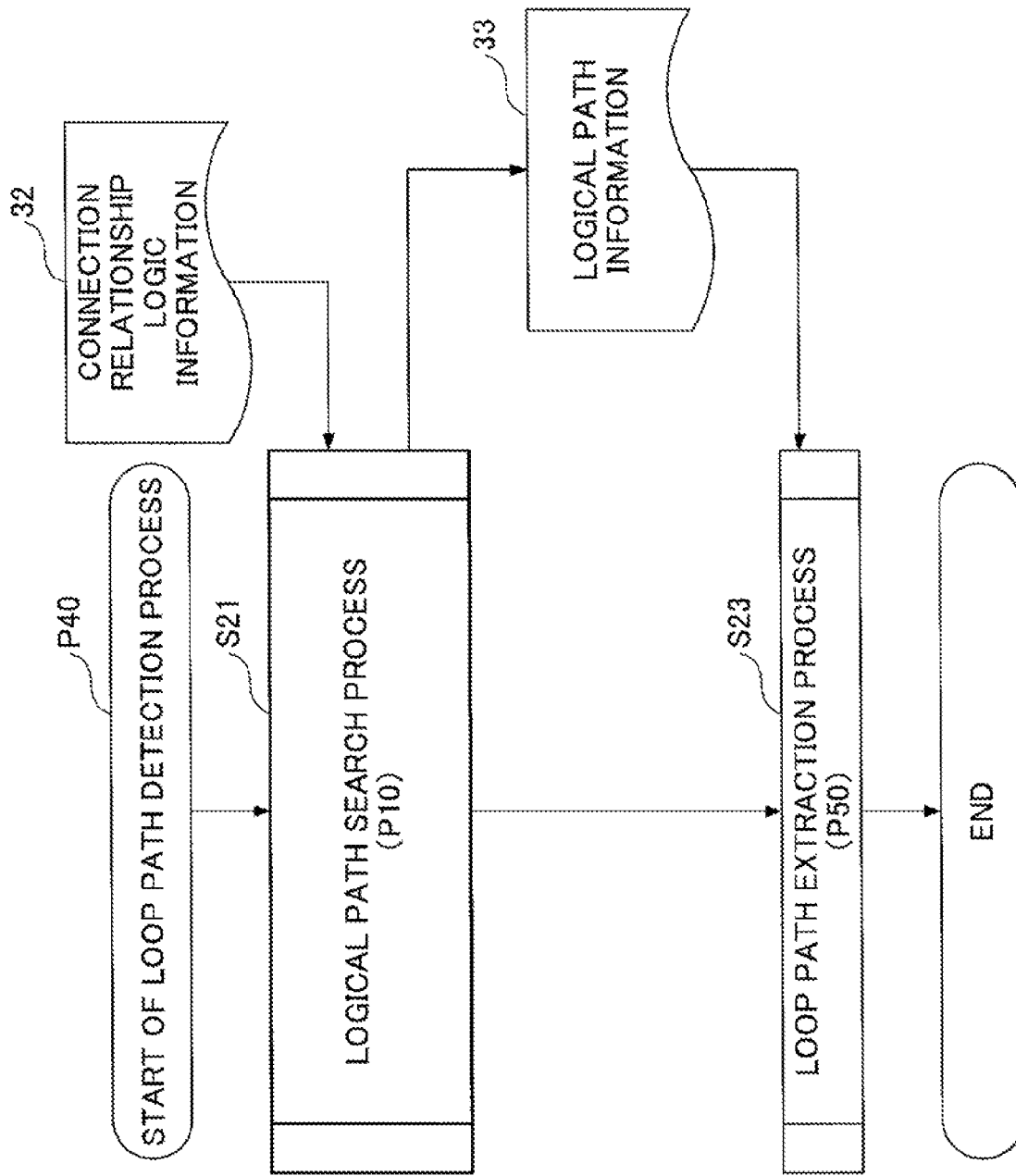
FIG. 12A and FIG. 12B are flowcharts for explaining the loop path detection process for detecting all loop paths in a third application example of the logical path search process.
Figure 12B:
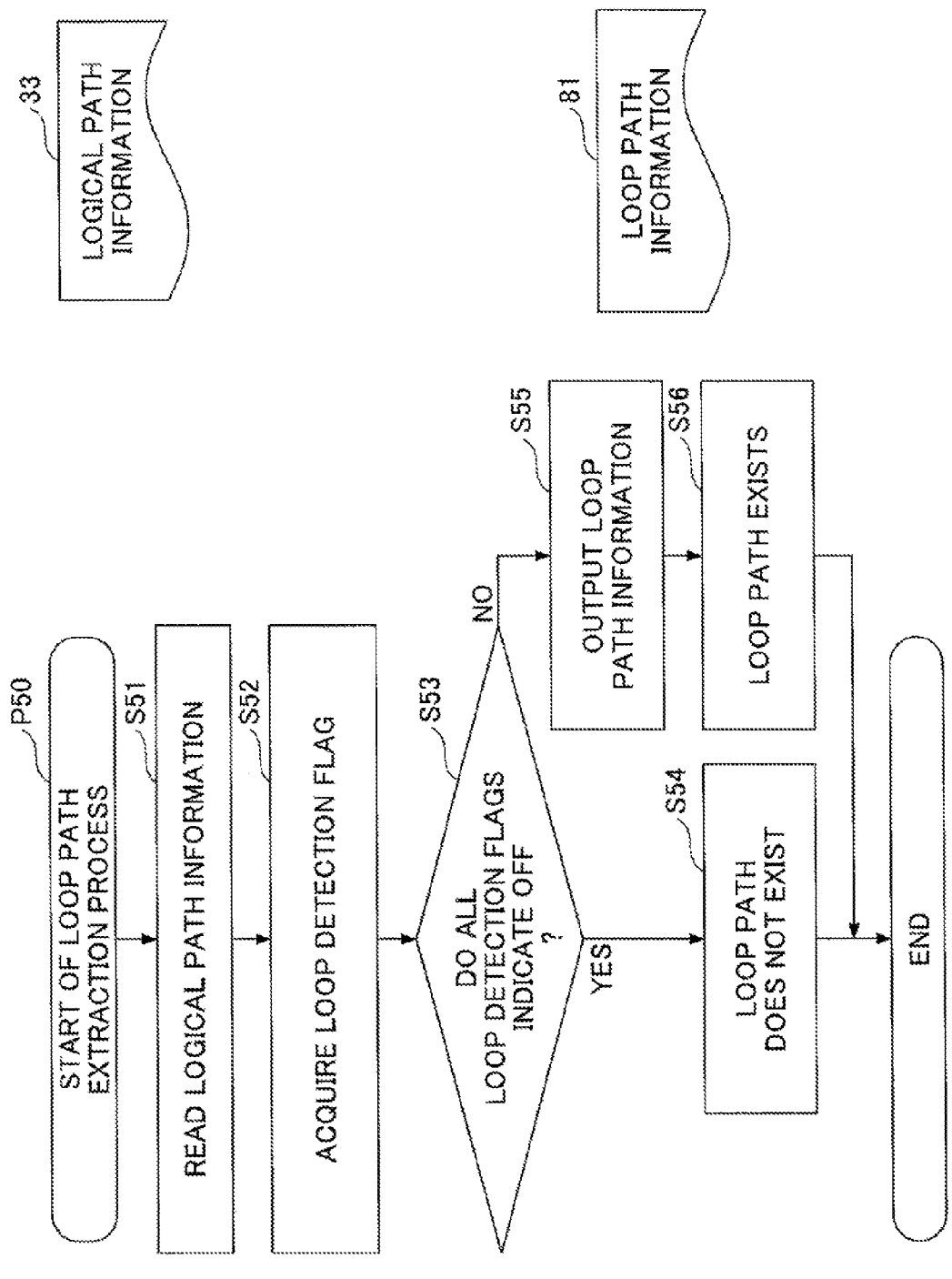

FIG. 12A and FIG. 12B are flowcharts for explaining the loop path detection process for detecting all loop paths in the third application example of the logical path search process.

A loop path detection process P40 illustrated in FIG. 12A is conducted by the CPU 11 executing a respective program, and is regarded as a process for detecting all loop paths.

In the loop path detection process P40 for detecting all loop paths, items below are assumed.
search signal: the data signal is used.
control signal: not used.
logic condition: different from an actual circuit operation, the input terminal and the output terminal having the logical relationship are logically connected. All cells are targeted.

In the loop path detection process P40, the connection relation logic information 32, in which the connection condition is replaced so that the input terminal and the output terminal having the logical relationship are logically connected without the logic condition, is used.

In the loop path detection process P40, the CPU 11 conducts the logical path search process P10 (step S21). The CPU 11 refers to the flag information 5f of the logical path information 33 acquired in the logical path search process P10, and conducts a loop path extraction process P50 for extracting a loop path based on the loop detection flag indicating ON (step S23). Then, the CPU 11 terminates the loop path detection process P40.

Referring to FIG. 12B, the loop path extraction process P50 in the step S23 in FIG. 12A will be described. In FIG. 12B, the CPU 11 starts the loop path extraction process P50, and reads the logical path information 33 from the storage part (step S51). Then, the CPU 11 acquires a value of the loop detection flag for each logical path from the logical path information 33 (step S52).

The CPU 11 determines whether the loop detection flag indicates OFF, for each of all logical paths (step S53). When the loop detection flag indicates OFF in all sets of the input information for the arrival points corresponding to the path search origin, the CPU 11 determines that the loop path does not exist (step S54). Then, the CPU 11 terminates the loop path extraction process P50. In the step S54, the CPU 11 may display, at the display unit 13, and notify to the circuit designer in a message indicating that the loop path does not exist.

On the other hand, in the step S54, in a case where the loop detection flag indicates ON for the input information of more than one arrival point, the CPU 11 traces back from the module for which the loop detection flag indicates ON, and sets the input information for which the passage flag indicates ON in the logical path information 33 as a target, thereby the logical path is extracted (step S55). In step S55, loop path information 81 indicating the extracted logical path is output and stored in the storage part. The CPU 11 determines whether the loop path exists (step S56). Then, the CPU 11 terminates the loop path extraction process P50. In the step S56, the CPU 11 may display, at the display unit 13, and notify to the circuit designer in a message indicating that the loop path exists.

[Fourth Application Example]

Next, a variation of the loop path detection process P40 in the third application example will be described as a fourth application example. The loop path detection process P40 according to the third application example detects an unintended loop path alone. In the fourth application example, recognized loop paths are excluded from all sets of the loop path information 81 detected in the loop path detection process P40 in the third application example described with reference to FIG. 13A and FIG. 13B. Then, the unintended loop path is detected.

Figure 13A:
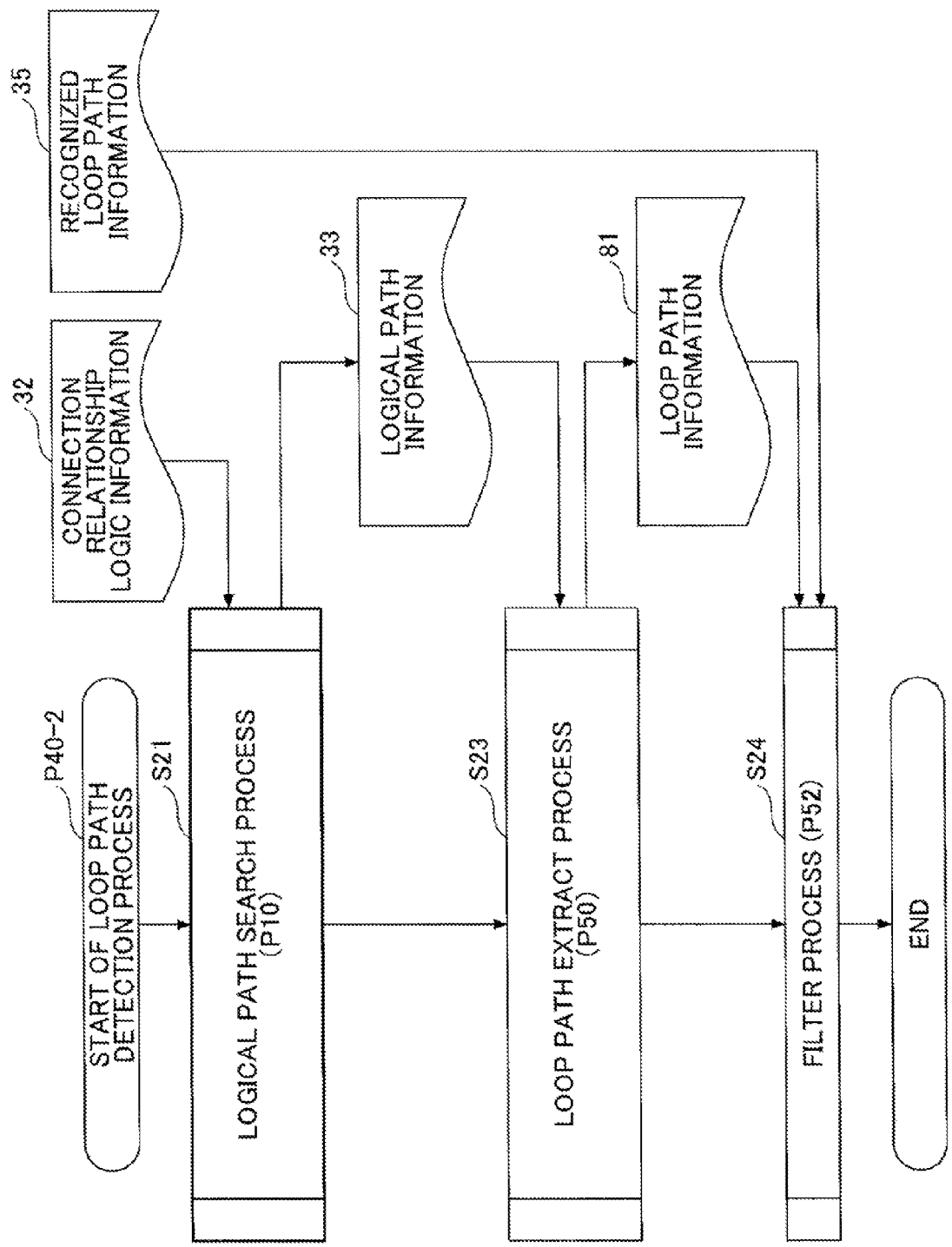
FIG. 13A and FIG. 13B are flowcharts for explaining another loop path detection process for detecting an unintended loop path in a fourth application example of the logical path search process.
Figure 13B:
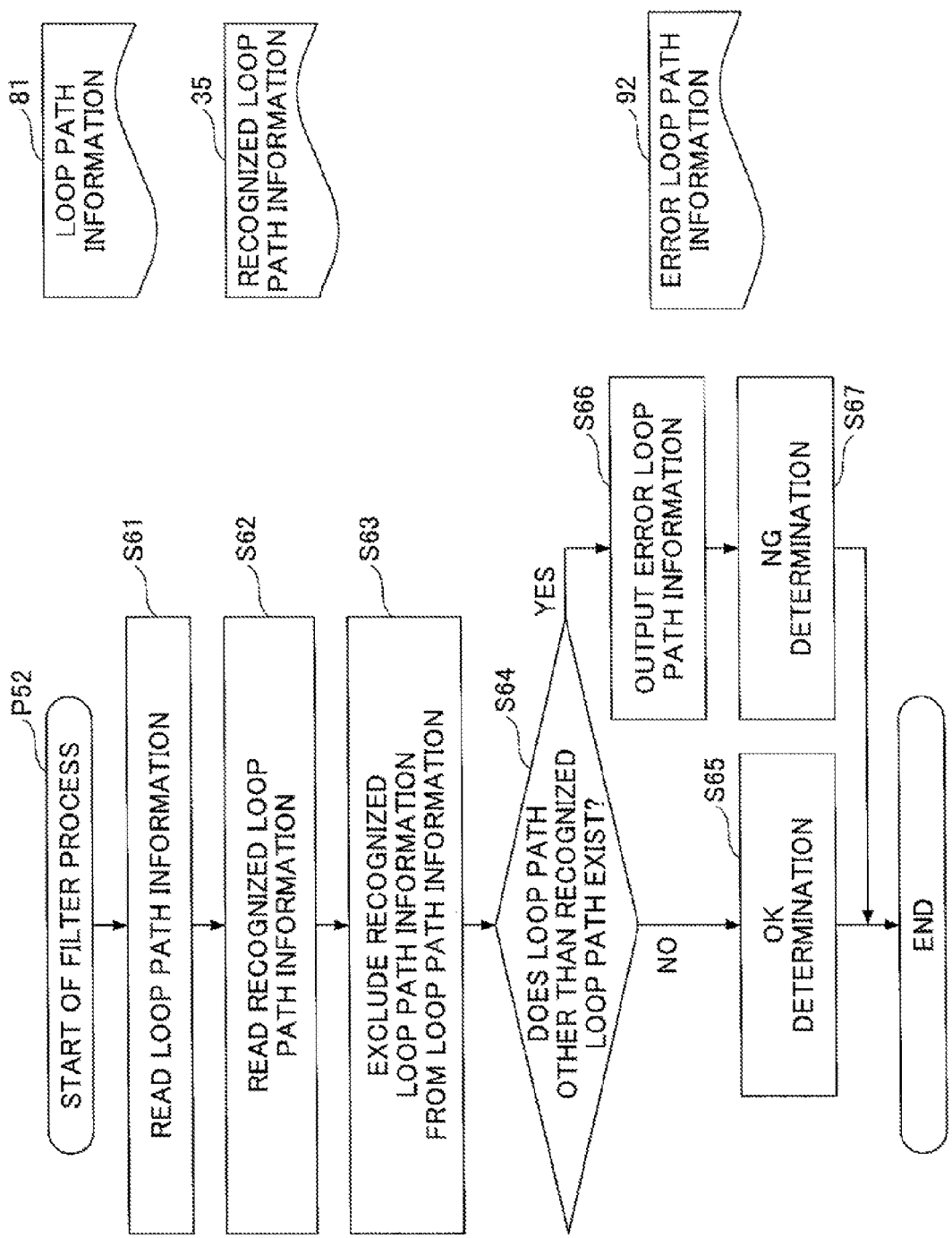

FIG. 13A and FIG. 13B are flowcharts for explaining another loop path detection process for detecting the unintended loop path in the fourth application example of the logical path search process. A loop path detection process P40 illustrated in FIG. 13A is conducted by the CPU 11 executing a respective program, and is regarded as a process for detecting unintended loop paths alone.

Figure 14:
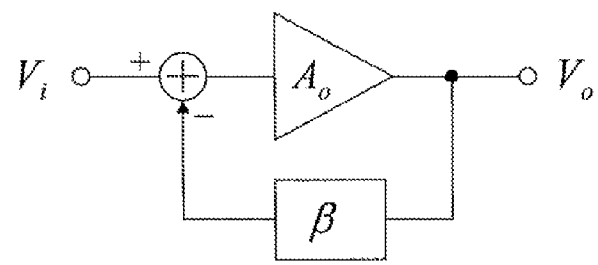
FIG. 14 is a diagram illustrating an example of a negative feedback loop circuit.

The unintended loop path may be regarded as a path forming a negative feedback loop which may cause an error due to oscillation or the like. In a recent circuit configuration being large scale and complicated, the negative feedback loop unintended by the circuit designer may be formed. For example, as illustrated in FIG. 14, a negative feedback loop circuit 98 having a circuit configuration of $V_o=A_0/(1+A_0\beta)$ may be formed.

Recognized loop path information 35 includes information of a loop path recognized by a specification or the like in which the loop path is designed in a circuit configuration. The recognized loop path information 35 is created by the circuit designer beforehand and is stored in the storage part.

In the loop path detection process P40-2 for detecting an unintended loop path alone, items below are assumed.
search signal: the data signal is used.
control signal: not used.
logic condition: different from the actual circuit operation, the input terminal and the output terminal having the logical relationship are logically connected. All cells are targeted.

Similar to the loop path detection process P40 in the third application example, in the loop path detection process P40-2, the connection relationship logic information 32, in which the connection condition is replaced so that the input terminal and the output terminal having the logical relationship are logically connected without the logic condition.

In the loop path detection process P40-2, similar to the loop path detection process P40 in the third application example, the CPU 11 conducts the logical path search process P10 in the step S21 and the loop path extraction process P50 in the step S23. After that, the CPU 11 conducts a filter process P52 for excluding the recognized loop path information 35 from the loop path information 81 acquired in the loop path extraction process P50 (step S24). Then, the CPU 11 terminates the loop path detection process P40-2.

Referring to FIG. 13B, the filter process P52 in the step S24 in FIG. 13A will be described. In FIG. 13B, the CPU 11 starts the filter process P52, and reads the loop path information 81 acquired in the loop path extraction process P50 from the storage part (step S61). The CPU 11 further reads the recognized loop path information 35 (step S62).

After that, the CPU 11 excludes the recognized loop path information 35 from the loop path information 81 (step S63). Then, the CPU 11 determines whether a loop path other than the recognized loop paths exists, by checking whether data remain in the loop path information 81 (step S64). When it is determined that the loop path other than the recognized loop paths does not exist, the CPU 11 determines that the unintended loop path such as the negative feedback loop or the like does not exist (step S65). Then, the CPU 11 terminates the filter process P52. In the step S65, the CPU 11 may display, at the display unit 13, and notify to the circuit designer in a message indicating that the unintended loop path does not exist.

On the other hand, in the step S64, when it is determined that the loop path other than the recognized loop paths exists, the CPU 11 outputs error loop path information 92 indicating the loop path information 81 excluding the recognized loop path information 35 to the storage part (step S66). Also, the CPU 11 determines that the unintended loop path such as the negative feedback loop or the like exists (step S67). Then, the CPU 11 terminates the filter process P52. In the step S67, the CPU 11 may display, at the display unit 13, and notify to the circuit designer in a message indicating that the unexpected loop path exists.

Next, a power domain boundary detection process applying the logical path search process will be described as a fifth application example.

[Fifth Application Example]

In a multi-power supply circuit, it is required to conduct processes for a power domain boundary, such as masking an output signal from a power shutdown circuit, shifting a power level for a different level, and the like. In a digital circuit, it is possible to confirm the power domain boundary by a formal verification using a power specification as an input. However, there is no scheme to confirm the power domain boundary in a configuration mixing with an analog circuit. In the fifth application example, even in a digital-analog mixed configuration, it is possible to detect the power domain boundary by extracting a circuit which operates by power different from that of an output signal.

Figure 15A:
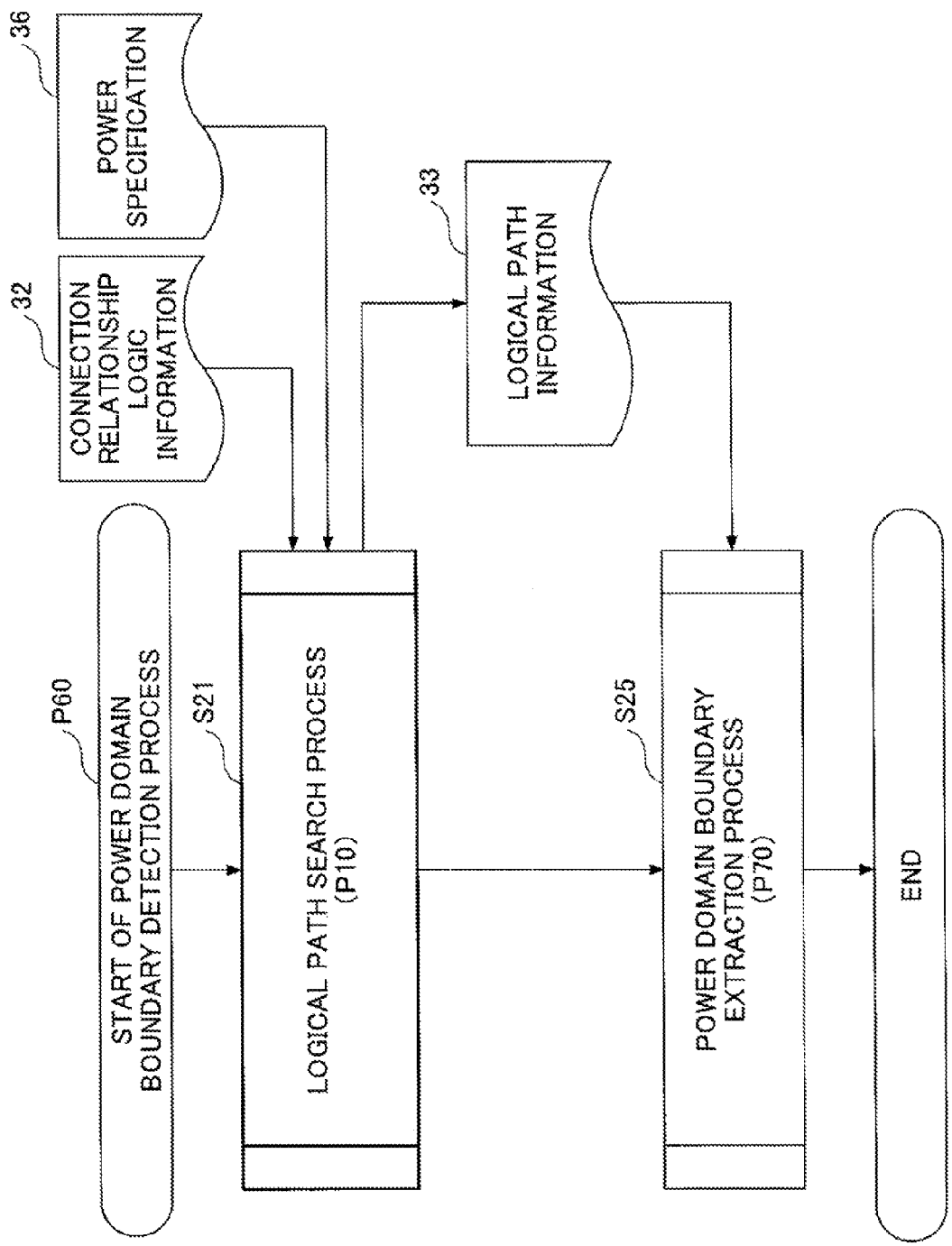
FIG. 15A and FIG. 15B are flowcharts for explaining a power domain boundary detection process in a fifth application example of the logical path search process.
Figure 15B:
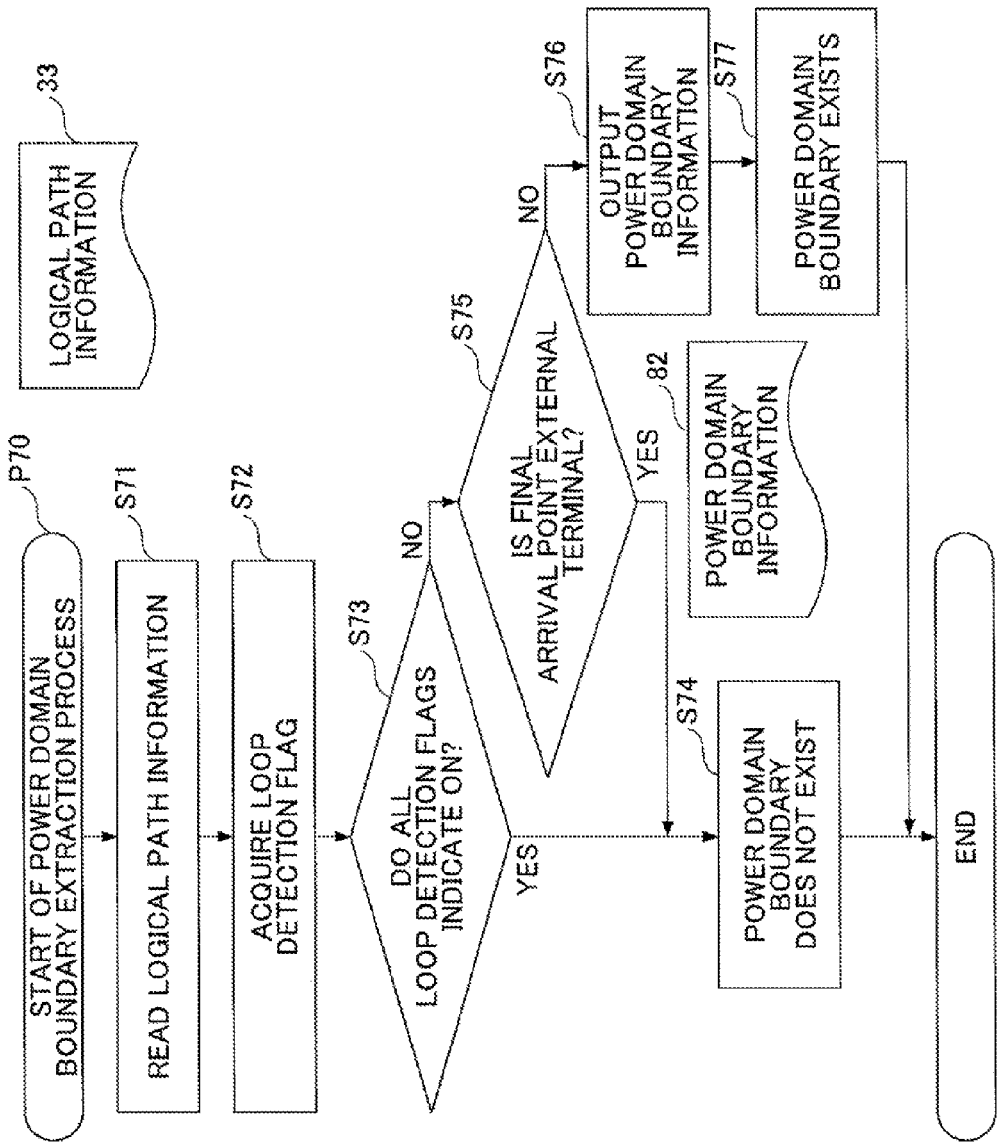

FIG. 15A and FIG. 15B are flowcharts for explaining a power domain boundary detection process, in the fifth application example of the logical path search process. A power domain boundary detection process P60 illustrated in FIG. 15A is conducted by the CPU 11 executing a respective program, and is regarded as a process for detecting the power domain boundary.

A power specification 36 is regarded as information defining a power domain, a power level, a power shutdown condition, and the like for each group of circuits which operate by the same power source, and is created and stored beforehand in the storage part.

In the power domain boundary detection process P60, items below are assumed.

search signal: the data signal is used.
control signal: not used.
logic condition: different from the actual circuit operation, the input terminal and the output terminal having the logical relationship are logically connected. All cells are targeted.

In the logical path search process P10 of the power domain boundary detection process P60, the connection relationship logic information 32, in which the connection condition is replaced to indicate a logic related to power source for all cells, is used. Also, the power specification 36, which indicates a relationship between each of modules and the power source, is referred to. When arriving at a module operating by a different power from that of a search originator, the path search ends.

Also, in a power domain boundary extraction process P70, the logical paths, which are detected as the loop path or for which the path search ends due to arriving at an external terminal, are excluded from the logical path information 33 acquired in the logical path search process P10. Thus, all power domain boundaries are detected.

In the power domain boundary detection process P60, the CPU 11 conducts the logical path search process P10 (step S21). the CPU 11 refers to the flag information 5$f$ of the logical path information 33 acquired in the logical path search process P10, and attempts to extract the input information indicating that the final arrival point is the external terminal, from sets of the input information in which the loop detection flag indicates ON. When the input information indicating that the final arrival point is the external terminal is extracted, the CPU 11 conducts the power domain boundary extraction process P70 for detecting the power domain boundary (step S25). Accordingly, the CPU 11 terminates the power domain boundary detection process P60.

Referring to FIG. 15B, the power domain boundary extraction process P70 in the step S25 of FIG. 15A will be described. In FIG. 15B, the CPU 11 starts the power domain boundary extraction process P70, and reads the logical path information 33 from the storage part (step S71). The CPU 11 acquires a value of the loop detection flag for each set of the input information from the logical path information (step S72).

The CPU 11 determines whether the loop detection flag indicates ON for each set of the input information (step S73). When the loop detection flag indicates ON for all sets of the input information, the CPU 11 determines that the power domain boundary does not exist (step S74). The CPU 11 terminates the power domain boundary extraction process P70. In the step S74, the CPU 11 may display, at the display unit 13, and notify to the circuit designer in a message indicating that the power domain boundary does not exist.

On the other hand, in the step S74, when the loop detection flag indicates OFF for at least one set of the input information, after the CPU 11 excludes the input information for which the loop detection flag indicates ON from the logical path information 33, the CPU 11 determines whether the final arrival point is the external terminal, for each set of the input information for which the passage flag indicates OFF as well as the loop detection flag indicates OFF (step S75). When the final arrival point is the external terminal in all sets of the input information for which the passage flag indicates OFF as well as the loop detection flag indicates OFF, the CPU 11 determines that the power domain boundary does not exist, and advances to the step S74.

On the other hand, in the step S75, when the final arrival point is not the external terminal for all sets of the input information for which the loop detection flag indicates OFF, after the CPU 11 further excludes the information in which the final arrival point from the logical path information 33, the CPU 11 outputs power domain boundary information 82 based on remaining sets of the input information for which the loop detection flag indicates OFF and in which the final arrival point is the external terminal, to the storage part (step S76). The CPU 11 determines that the power domain boundary exists (step S77), and terminates the power domain boundary extraction process P70. In the step S77, the CPU 11 may display, at the display unit 13, and notify to the circuit designer in a message indicating that the power domain boundary exists.

Next, a clock domain boundary detection process applying the logical path search process will be described as a sixth application example.

[Sixth Application Example]

In a case of including synchronous circuits for multiple clocks in the integrated circuit, it is required to conduct a clock transfer process at a clock domain boundary. In the digital circuit, it is possible to confirm the clock domain boundary by a formal verification. However, in the digital-analog mixed configuration, there is no scheme to confirm the clock domain boundary. In the sixth application example, even in the digital-analog mixed configuration, it is possible to detect the clock domain boundary by extracting a circuit operating by a clock different from the output signal. The clock domain is regarded as a group of circuits operating by the same clock.

Figure 16A:
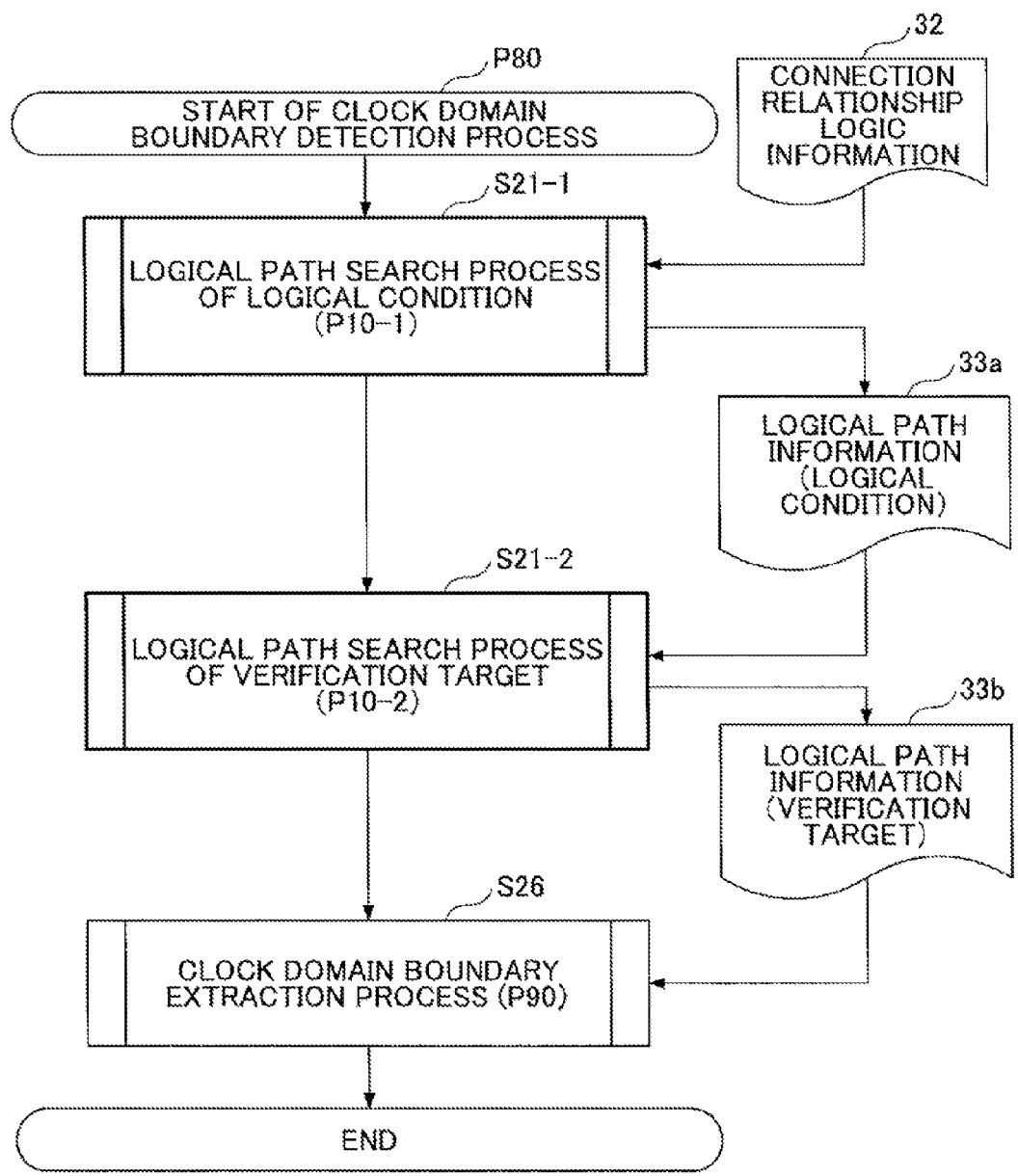
FIG. 16A and FIG. 16B are flowcharts for explaining a clock domain boundary detection process in a sixth application example of the logical path search process.
Figure 16B:
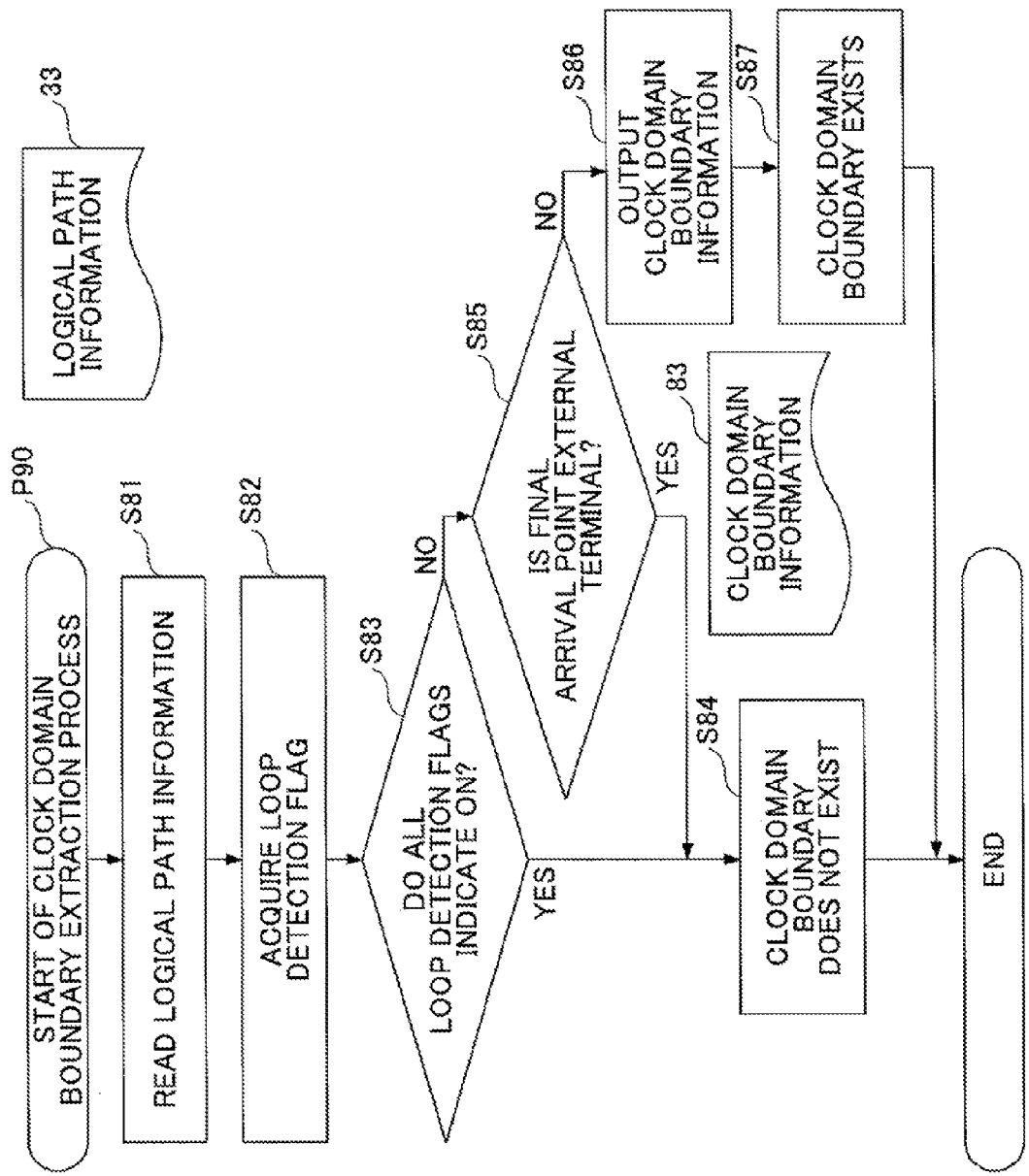

FIG. 16A and FIG. 16B are flowcharts for explaining the clock domain boundary detection process in the sixth application example of the logical path search process. The clock domain boundary detection process illustrated in FIG. 16A is conducted by the CPU 11 executing a respective program, and is regarded as a process for detecting the clock domain boundary.

In a clock domain boundary detection process P90, items below are assumed.
 search signal: the data signal is used.
 control signal: a clock signal is used.
 logic condition: different from the actual circuit operation, the input terminal and the output terminal having the logical relationship are logically connected. All cells are targeted.

In the logical path search process P10-1 of the logic condition and logical path search process P10-2 of a detection target node in the clock domain detection process P80, the connection relationship logic information 32, in which the connection condition is replaced to indicate a logic related to a clock for all cells, is used. When arriving at a module operating by a different clock from that of the search originator, the path search ends.

Moreover, in the clock domain boundary extraction process P90, all clock domain boundaries are detected from the logical path information 33b acquired by the logical path search process P10-2, by excluding the logical path in which the path search is ended by the loop detection or at the external terminal.

In the clock domain boundary detection process P80, the CPU 11 conducts the logical path search process P10-1 of the logic condition by using the connection relationship logic information 32 (step S21-1). Then, the CPU 11 conducts the logical path search process P10-2 of the verification target by using the logical path information 33a acquired in the logical path search process P10-1 (step S21-2). After that, the CPU 11 conducts the clock domain boundary extraction process P90 by using the logical path information 33b acquired in the logical path search process P10-2 (step S26). The CPU 11 terminates the clock domain boundary detection process P80.

Referring to FIG. 16B, the clock domain boundary detection process P80 in step S26 in FIG. 16A will be described. In FIG. 16B, the CPU 11 starts the clock domain boundary extraction process P90, and reads the logical path information 33 (step S81). The CPU 11 acquires the loop detection flag for each set of the input information from the logical path information 33 (step S82).

The CPU 11 determines whether the loop detection flag indicates ON, for all sets of the input information (step S83). When the loop detection flag indicates ON for all sets of the input information, the CPU 11 determines that the clock domain boundary does not exist (step S84). The CPU 11 terminates the clock domain boundary extraction process P90. In the step S84, the CPU 11 may display, at the display unit 13, and notify to the circuit designer in a message indicating that the clock domain boundary does not exist.

On the other hand, in the step S84, when the loop detection flag indicates OFF for more than one set of the input information, the CPU 11 excludes the input information for which the loop detection flag indicates ON, and determines whether the final arrival point is the external terminal, for all sets of the input information for which the loop detection flag indicates OFF (step S85). When the final arrival point is the external terminal for all sets of the input information for which the loop detection flag indicates OFF, the CPU 11 determines that the clock domain boundary does not exist (step S84).

On the other hand, in the step S85, when the final arrival point is not the external terminal for all sets of the input information for which the loop detection flag indicates OFF, the CPU 11 further excludes the input information in which the final arrival point is the external terminal, and outputs the clock domain boundary information 83 based on remaining sets of the input information for which the loop detection flag indicates OFF and in which the final arrival point is the external terminal to the storage part (step S86). The CPU 11 determines that the clock domain exists (step S87). The CPU 11 terminates clock domain boundary extraction process P90. In the step S87, the CPU 11 may display, at the display unit 13, and identify the circuit designer a message indicating that the clock domain boundary exists.

Next, input data and output data in the above-described application examples will be described with reference to an integrated circuit 200 in FIG. 17 as an example.

Figure 17:
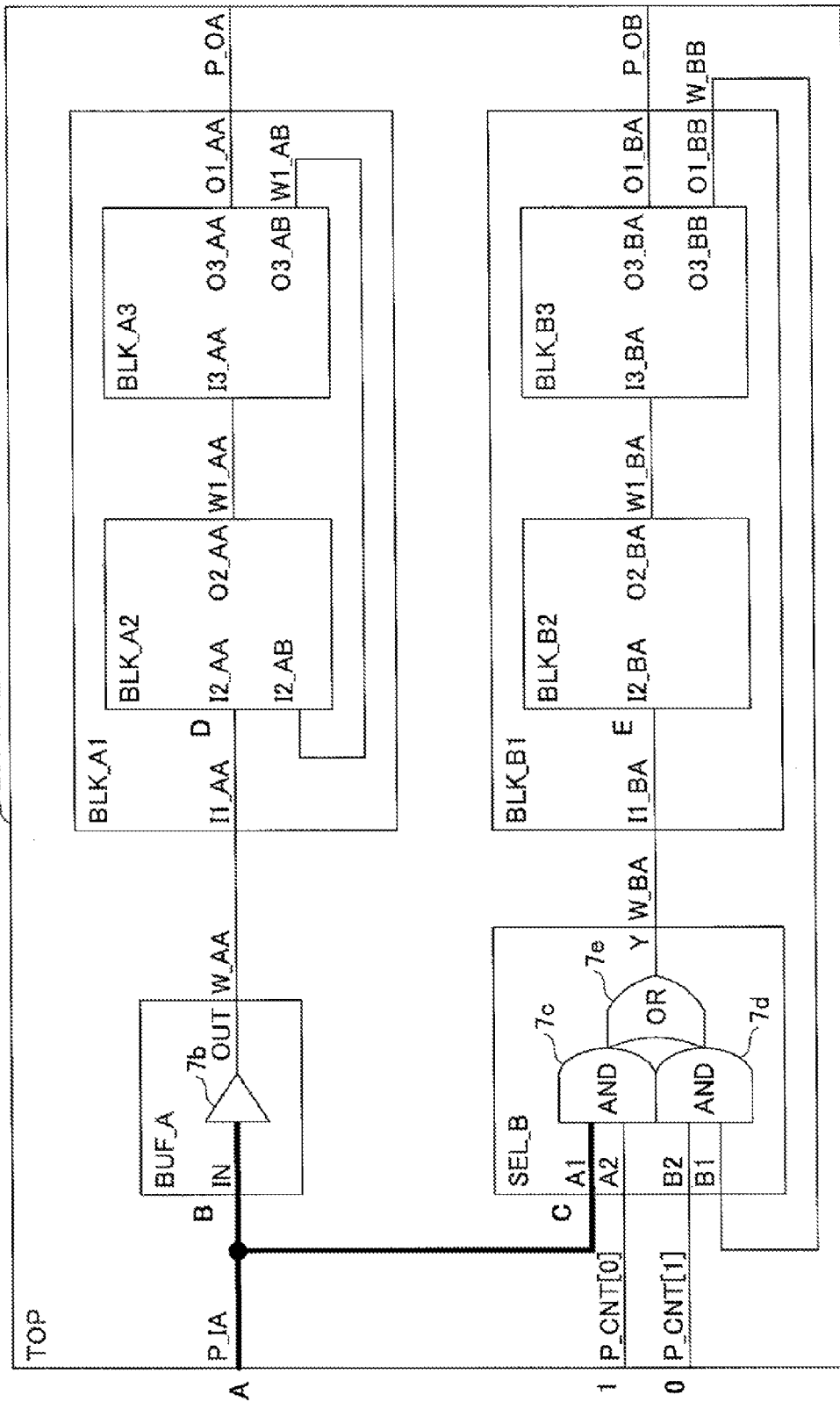
FIG. 17 is a diagram illustrating an example of an integrated circuit to explain a path search.

FIG. 17 is a diagram illustrating an integrated circuit example to explain the path search. In FIG. 17, the connection relationship is depicted by a data signal line. The integrated circuit 200 illustrated in FIG. 17 includes modules BUF_A, BLK_A1, SEL_B, and BL_B1, external input terminals P_IA, P_CNT[0], and P_CNT[1], and external output terminals P_OA and P_OB.

Moreover, the module BUF_A includes an input terminal IN which inputs data from the external input terminal P_IA, an output terminal OUT which outputs data (W_AA) to a module BLK_A1, and a buffer 7b.

The module BLK_A1 includes an input terminal I1_AA which inputs data from the module BUF_A, an output terminal O1_AA which outputs data to the external output terminal P_OA, and modules BLK_A2 and BLK_A3.

The module BLK_A2 includes an input terminal I2_AA which inputs data from the input terminal I1_AA of the module BLK_A1, an input terminal I2_AB which inputs data from an output terminal O3_AB of the module BLK_A3, and an output terminal O2_AA which outputs data (W1 AA) to the module BLK_A3.

The model BLK_A3 includes an input terminal I3_AA which inputs data from the module BLK_A2, an output terminal O3_AA which outputs data to an output terminal O1_AA of the module BLK_A1, and an output terminal O3_AB which outputs data (W1_AB) from the input terminal I2_AB of the module BLK_A2.

The module SEL_B includes an input terminal A1 which inputs data from the external input terminal P_IA, an input terminal A2 which inputs data from an external terminal P_CNT[0], an input terminal B2 which inputs data from external terminal P_CNT[1], an input terminal B1 which inputs data from an output terminal O1_BB of the module BLK_B1, an output terminal Y which outputs data (W_BA) to the module BLK_B1, an AND circuit 7c which inputs data from input terminals A1 and A2, an AND circuit 7d which inputs data from input terminal B1 and B2, and an OR circuit 7e which inputs data from the AND circuit 7c and the AND circuit 7d and outputs to the output terminal Y.

The module BLK_B1 includes an input terminal I1_BA which inputs data from the module SEL_B, an output terminal O1_BA which outputs data to the external output terminal P_OB, an output terminal O1_BB which outputs data to the input terminal B1 of the module SEL_B, and modules BLK_B2 and BLK_B3.

The module BLK_B2 includes an input terminal I2_BA which inputs data from the input terminal I1_BA of the module BLK_B1, and an output terminal O2_BA which outputs data (W1_BA) to the module BLK_B3.

The module BLK_B3 includes an input terminal I3_BA which inputs data from the module BLK_B2, an output terminal O3_BA which outputs data to the output terminal O1_BA of the module BLK_B1, and an output terminal O3_BB which outputs data (W_BB) to the input terminal B1 of the module SEL_B.

FIG. 18A through FIG. 18C are diagrams illustrating data examples in a case of conducting the first application example illustrated FIG. 10A and FIG. 10B. In FIG. 18A, connection relationship logic information 32-1 is limited to the logic gate which does not require the logic condition in the path. In the integrated circuit 200 illustrated in FIG. 17, the module BUF_A alone is indicated in the connection relationship logic information 32-1. In this case, the connection condition is simply indicated so that data output from the output terminal OUT is input to the input terminal IN.

In the connection specification 34-1 in FIG. 18B, a combination of the connection originator point and the connection destination point for which the connection condition does not indicate the logic condition is illustrated. The connection specification 34-1 related to the integrated circuit 200 illustrated in FIG. 17 indicates that the connection originator point "P_IA" and the connection destination point "BLK_A1.BLK_A2.I2_AA" are connected, and the connection originator "P_IA" and the connection destination point "SEL_B.A1" are connected.

Logical path information 33-1 in FIG. 18C indicates the logical path acquired the path search in the case of the first application example in FIG. 10 in which the logic condition is not required. It is determined in the connection verification determination process P30 (FIG. 10B) whether the path search origin and the arrival point indicated in the logical path information 33-1 correspond to connection specification 34-1. As a result, one logical path, which is defined by the path search origin "P_IA" and the arrival point "SEL_B.A1", and another logical path, which is defined by the path search origin "P_IA" and a next path search origin "BUF_A.OUT", meet the connection specification 34-1, by the logical path information 33-1.

Accordingly, referring to FIG. 17, instead of the logical path search process P10 in FIG. 10A, if the conventional path search is applied in the first application example, the path search is conducted only from the path search origin A (P_IA) to the arrival point B (BUF_A.IN) and cannot be further conducted after the arrival point B (BUF_A.IN). In the first application example applying the logical path search process P10, it is possible to realize the path search from the path search origin A (P_IA) to an arrival point D (BLK_A1.BLK_A2.I2_AA).

FIG. 19A through FIG. 19D are diagrams illustrating data examples in a case of conducting the second application example in FIG. 11. In FIG. 19A, connection relationship logic information 32-2 is limited to the logic gates which are included in the path and include logic gate in which the input terminal and the output terminal are logically connected by the logic condition. Thus, the connection relationship logic information 32-2 indicates the module SEL_B as well as the module BUF_A indicated in the connection relationship logic information 32-1 illustrated in FIG. 18. For the module SEL_B, the logic condition "Y=(A1&A2)|(B1&B2)" is indicated by the connection condition.

In FIG. 19B, a connection specification 34-2 indicates a combination of the connection originator point and the connection destination point having the logic condition for each connection condition. For the integrated circuit 200 in FIG. 17, the connection specification 34-2 defines that the connection originator point "P_IA" and the connection destination point "BLK_A1.BLK_A2.I2_AA" are connected without the logic condition, and the connection originator point "P_IA" and the connection destination point "BLK_B1.BLK_B2.I2_BA" are connected based on the logic condition "P_CNT[1:0]=2' b01".

In FIG. 19C, logical path information 33a-2 indicates the logical paths acquired by the path search concerning the logic condition which is conducted in the logical path search process P10-1 of the logic condition. For the integrated circuit 200 in FIG. 17, the logical path information 33a-2 defines a logical path from the path search origin "P_CNT[0]" and the arrival point "SEL_B.A2" and a logical path from the path search origin "P_CNT[1]" and the arrival point "SEL_B.B2".

In FIG. 19D, logical path information 33b-2 indicates the logical paths acquired by the path search concerning the logic condition which is conducted by the logical path search process P10-2 of the verification target. In the connection verification determination process P30 (FIG. 10B), it is determined whether the path search origin and the arrival point, which are indicated by the logical path information 33b-2, correspond to those defined in the connection specification 34-2. One logical path is indicated from the path search origin "P_IA" to the arrival point "BLK_A1.BLK_A2.I2_AA" via the next path search origin "BUF_A.OUT". Another logical path is indicated from the path search origin "P_IA" to the arrival point "BLK_B1.BLK_B2.I2_BA" via the next path search origin "SEL_B.Y". Also, in the connection verification determination process P30, it is determined that both logical paths correspond to those defined in the connection specification 34-2.

Accordingly, referring to FIG. 17, instead of the logical path search processes P10-1 and P10-2, if the conventional path search is applied in the second application example in FIG. 11, the path search is conducted only from the path search origin A (P_IA) to the arrival point B (BUF_A.IN) and cannot be further conducted after the arrival point C (SEL_B.A1). In the second application example applying the logical path search processes P10-1 and P10-2, it is possible to realize the path search from the path search origin A (P_IA) to an arrival point E (BLK_B1.BLK_B2.I2_BA).

FIG. 20A through FIG. 20C are diagrams illustrating data examples in a case of conducting the third application example in FIG. 12A and FIG. 12B. In FIG. 20A, connection relationship logic information 32-3 indicates modules and the connection condition for logically connecting the input terminal and the output terminal having the logical relationship without the logic condition for each of the modules.

The connection condition "OUT=IN" is indicated to logically connect in the module BUF_A without the logic condition. The connection condition "Y=A1,Y=A2,Y=B1,Y=B2" is indicated to logically connect in the module SEL_B without the logic condition. The connection condition "O2_AA=I2_AA, O2_AA=I2_AB" is indicated to logically connect in the module BLK_A2 without the logic condition. The connection condition "O3_AA=I3_AA, O3_AB=I3_AA" is indicated to logically connect in the module BLK_A3 without the logic condition. The connection condition "O2_BA=I2_BA" is indicated to logically connect in the module BLK_B2 without the logic condition. The connection condition "O3_BA=I3_BA, O3_BB=I3_BA" is indicated to logically connect in the module BLK_B3 without the logic condition.

In FIG. 20B, logical path information 33-3 indicates a search result from the logical path search process P10 in which the external input terminal "P_IA" is set as the path search origin. In FIG. 20C, loop path information 81-3 indicates the logical paths extracted by tracing back from a module for which the loop detection flag indicates ON, in sets of the input information in which the passage flag indicates ON, if there is the input information for which the loop detection flag indicates ON in the logical path information 33.

In this example, two logical paths are extracted. One logical path is indicated as "BUF_A.OUT"-> "BLK_A1.BLK_A2.O2_AA"-> "BLK_A1.BLK_A3.O3_AA". Another logical path is indicated as "P_IA"->"SEL_B.Y"-> "BLK_B1.BLK_B2.O2_BA"-> "BLK_B1.BLK_B3.O3_BB".

In the fourth application example illustrated in FIG. 13, it is possible to detect the unintended loop path such as the negative feedback loop, by filtering the extracted logical paths.

FIG. 21A through FIG. 21D are diagrams illustrating data examples in a case of conducting a fifth application example illustrated in FIG. 15. In FIG. 21A, the connection relationship logic information 32-4 indicates modules and the connection condition which is different from the actual operation and is referred to logically connect the input terminal and the output terminal having the logical relationship in the power domain, for each of the modules.

The connection condition "OUT=IN" is indicated to logically connect in the module BUF_A in the power domain. The connection condition "Y=A1,Y=A2,Y=B1,Y=B2" is indicated to logically connect in the module SEL_B in the power domain. The connection condition "O2_AA=I2_AA, O2_AA=I2_AB" is indicated to logically connect in the module BLK_A2 in the power domain.

The connection condition "O3_AA=I3_AA, O3_AB=I3_AA" is indicated to logically connect in the module BLK_A3 in the power domain. The connection condition "O2_BA=I2_BA" is indicated to logically connect in the module BLK_B2 in the power domain. The connection condition "O3_BA=I3_BA, O3_BB=I3_BA" is indicated to logically connect in the module BLK_B3 in the power domain.

In FIG. 21B, the power specification 36-4 indicates the power domain for each of modules. In a circuit configuration of the integrated circuit 200 illustrated in FIG. 17, the power domain of the module BUF_A is "PD1", the power domain of the module SEL_B is "PD1", and the power domain of the module BLK_A2 is "PD2". The power domain of the module BLK_A3 is "PD2", the power domain of the module BLK_B2 is "PD3", and the power domain of the module BLK_B3 is "PD3".

In FIG. 21C, the logical path information 33-4 indicates a search result from the logical path search process P10 for each of the power domains PD1, PD2, and PD 3. The search result for the power domain PD1 is indicated in which the "P_IA" is defined as the path search origin. The search result for the power domain PD2 is indicated in which the "BLK_A1.BLK_A2.O2_AA" is defined as the path search origin. The search result for the power domain PD3 is indicated in which the "BLK_B1.BLK_B2.O2_BA" is defined as the path search origin.

In FIG. 21D, the power domain boundary information 82-4 indicates the logical paths representing the power domain boundary based on the input information in which the final arrival point is a terminal other than the external terminal, in target sets of the input information for which the passage flag indicates OFF and the loop detection flag indicates OFF, in which the loop detection flag indicates OFF in the logical path information 33-4.

In this example, two logical paths are extracted as the power domain boundaries of the power domain PD1. In the two logical paths, one logical path is indicated as "BUF_A.OUT"->"BLK_A1.BLK_A2.I2_AA", and another logical path is indicated as "SEL_B.Y"-> "BLK_B1.BLK_B2.I2_BA". Also, a logical path is extracted as the power domain boundary of the power domain PD3.

As described above, in the design verification apparatus 100 according to the embodiment, after the logical path search from a node regarded as the path search origin, it is determined whether a passage through a module can be made in accordance with the logic condition of the module (logic gate) at the arrival point. If the passage through the module can be made, a next node connected from the module (logic gate) is defined as the path search origin. Then, the logical path search is continued. Accordingly, in the embodiment, it is possible to further conduct the logical path search after the logic gate as described above.

Also, since a path search result can be acquired in a wider range by the logical path search passing through the logic gate, it is possible to verify the logic connection and to detect a loop portion causing oscillation or the like. Accordingly, it is possible to effectively detect a problem, which has been detected by using an actual device, in a design stage. Also, workload related to a visual verification by the circuit designer can be reduced. Therefore, it is possible to significantly reduce TAT (Turn around Time).

According to the embodiment, when a module connected to a target node is regarded as a predetermined module logically connectable inside to pass through, it is possible to realize a further connection verification from the module.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A connection verification method performed in a computer, the method comprising:
    verifying, by the computer, a connection between a first node and a second node by starting from the first node in a designed integrated circuit in a logical path search, based on connection information stored in a storage part;
    detecting, by the computer, whether a module connected to the second node is a predetermined module which has a logic condition for continuing the logical path search and is set as a logical path origin;
    conducting, by the computer, a connection verification starting the module to verify a connection between the module and a third node, by setting the module as the logical path origin when the module is the predetermined module;
    setting, by the computer, a loop detection flag for the module when a passage flag is set for the module;
    detecting, by the computer, the module where the loop detection flag is not set in a group of circuits which operate by the same power source; and
    determining, by the computer, a path from the module to a next node to be a power domain boundary, when the next node to be connected by starting from the module is a node other than an external terminal.

2. The connection verification method as claimed in claim 1, wherein when the module is not the predetermined module, the connection verification is terminated at the second node.

3. The connection verification method as claimed in claim 1, wherein the predetermined module does not require a logic condition for the logic connection.

4. The connection verification method as claimed in claim 1, wherein the predetermined module requires a logic condition for the logic connection, and
the conducting the connection verification includes:
detecting, by the computer, whether an input terminal and an output terminal of the module are connected based on the logic condition; and
conducting, by the computer, the connection verification starting from the module to the third node when the input terminal and the output terminal are connected.

5. The connection verification method as claimed in claim 1, further comprising:
detecting, by the computer, the module for which the loop detection flag is set; and
extracting, by the computer, loop paths in one or more logical paths formed by passing the module.

6. The connection verification method as claimed in claim 5, wherein a recognized loop path recognized by a specification is excluded from the loop paths being extracted.

7. The connection verification method as claimed in claim 6, wherein loop paths excluding the recognized loop path include a negative feedback loop.

8. The connection verification method as claimed in claim 1, wherein the passage flag is set for the module, when the connection verification starting from the module to the third node is conducted.

9. The connection verification method as claimed in claim 1, wherein an inversion flag is set for the module, when the connection verification starting from the module to the third node is conducted and an input signal is inversed by the module.

10. The connection verification method as claimed in claim 1, further comprising:
detecting, by the computer, the module where the loop detection flag is not set in a group of circuits which operate by the same clock; and
determining, by the computer, a path from the module to a next node to be a clock domain boundary, when the next node to be connected by starting from the module is a node other than an external terminal.

11. A non-transitory computer-readable recording medium recorded with a program which, when executed by a computer, causes the computer to perform a connection verification process comprising:
verifying a connection between a first node and a second node by starting from the first node in a designed integrated circuit in a logical path search, based on connection information stored in a storage part;
detecting whether a module connected to the second node is a predetermined module which has a logic condition for continuing the logical path search and is set as a logical path origin;
conducting a connection verification starting the module to verify a connection between the module and a third node, by setting the module as the logical path origin when the module is the predetermined module;
setting a loop detection flag for the module when a passage flag is set for the module;
detecting the module where the loop detection flag is not set in a group of circuits which operate by the same power source; and
determining a path from the module to a next node to be a power domain boundary, when the next node to be connected by starting from the module is a node other than an external terminal.

12. A connection verification apparatus comprising:
a processor; and
a storage part;
wherein the processor performs a process including:
verifying a connection between a first node and a second node by starting from the first node in a designed integrated circuit in a logical path search, based on connection information stored in the storage part;
detecting whether a module connected to the second node is a predetermined module which has a logic condition for continuing the logical path search and is set as a logical path origin;
conducting a connection verification starting the module to verify a connection between the module and a third node, by setting the module as the logical path origin when the module is the predetermined module;
setting a loop detection flag for the module when a passage flag is set for the module;
detecting the module where the loop detection flag is not set in a group of circuits which operate by the same power source; and
determining a path from the module to a next node to be a power domain boundary, when the next node to be connected by starting from the module is a node other than an external terminal.

* * * * *